(12) United States Patent
Lee et al.

(10) Patent No.: US 11,289,473 B2
(45) Date of Patent: Mar. 29, 2022

(54) SEMICONDUCTOR DEVICE

(71) Applicant: Samsung Electronics Co., Ltd., Suwon-si (KR)

(72) Inventors: Kiseok Lee, Hwaseong-si (KR); Chan-Sic Yoon, Anyang-si (KR); Dongoh Kim, Daegu (KR); Myeong-Dong Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/132,699

(22) Filed: Dec. 23, 2020

(65) Prior Publication Data
US 2021/0125980 A1 Apr. 29, 2021

Related U.S. Application Data

(63) Continuation of application No. 16/288,590, filed on Feb. 28, 2019, now Pat. No. 10,910,363.

(30) Foreign Application Priority Data

Apr. 24, 2018 (KR) ........................ 10-2018-0047410

(51) Int. Cl.
*H01L 21/70* (2006.01)
*H01L 27/06* (2006.01)
(Continued)

(52) U.S. Cl.
CPC .... *H01L 27/0617* (2013.01); *H01L 21/76831* (2013.01); *H01L 21/76832* (2013.01);
(Continued)

(58) Field of Classification Search
CPC ... H01L 27/0617; H01L 27/108; H01L 27/22; H01L 27/2436; H01L 21/76831; H01L 21/7683; H01L 21/823821; H01L 21/823842; H01L 21/823878; H01L 29/4966; H01L 29/66545; H01L 29/7851
(Continued)

(56) References Cited

U.S. PATENT DOCUMENTS 6,355,524 B1 3/2002 Tuan et al.
7,709,902 B2 5/2010 Doris et al.
(Continued)

FOREIGN PATENT DOCUMENTS

KR 10-2015-0088634 A 8/2015

OTHER PUBLICATIONS

Non-Final Office Action dated May 7, 2020 in U.S. Appl. No. 16/288,590.
(Continued)

*Primary Examiner* — Calvin Y Choi
(74) *Attorney, Agent, or Firm* — Harness, Dickey & Pierce, P.L.C.

(57) ABSTRACT

Disclosed is a semiconductor device comprising a substrate including a first region and a second region, a first gate pattern on the substrate of the first region, and a second gate pattern on the substrate of the second region. The first gate pattern comprises a first high-k dielectric pattern, a first N-type metal-containing pattern, and a first P-type metal-containing pattern that are sequentially stacked. The second gate pattern comprises a second high-k dielectric pattern and a second P-type metal-containing pattern that are sequentially stacked.

20 Claims, 26 Drawing Sheets

(51) Int. Cl.
*H01L 21/8238* (2006.01)
*H01L 21/768* (2006.01)
*H01L 29/78* (2006.01)
*H01L 29/66* (2006.01)
*H01L 29/49* (2006.01)
*H01L 27/24* (2006.01)
*H01L 27/108* (2006.01)
*H01L 27/22* (2006.01)

(52) U.S. Cl.
CPC ........... *H01L 21/823821* (2013.01); *H01L 21/823842* (2013.01); *H01L 21/823878* (2013.01); *H01L 29/4966* (2013.01); *H01L 29/66545* (2013.01); *H01L 29/7851* (2013.01); *H01L 27/108* (2013.01); *H01L 27/22* (2013.01); *H01L 27/2436* (2013.01)

(58) Field of Classification Search
USPC .......................................................... 257/369
See application file for complete search history.

(56) References Cited

U.S. PATENT DOCUMENTS

| | | |
|---|---|---|
| 7,838,908 B2 | 11/2010 | Kwon et al. |
| 8,349,680 B2 | 1/2013 | Thei et al. |
| 8,680,623 B2 | 3/2014 | Frank et al. |
| 8,698,249 B2 | 4/2014 | Mise et al. |
| 9,059,315 B2 | 6/2015 | Ando et al. |
| 9,209,089 B2 | 12/2015 | Chung et al. |
| 9,406,678 B2 | 8/2016 | Ji et al. |
| 2004/0007727 A1 | 1/2004 | Song |
| 2007/0082475 A1 | 4/2007 | Park |
| 2007/0205489 A1 | 9/2007 | Tilke et al. |
| 2010/0193880 A1 | 8/2010 | Yoshida et al. |
| 2012/0043614 A1 | 2/2012 | Choi et al. |
| 2012/0231600 A1 | 9/2012 | Yang et al. |
| 2015/0129932 A1 | 5/2015 | Lin et al. |
| 2015/0194423 A1 | 7/2015 | Wang et al. |
| 2018/0108745 A1 | 4/2018 | Li |

OTHER PUBLICATIONS

Notice of Allowance dated Sep. 21, 2020 in U.S. Appl. No. 16/288,590.

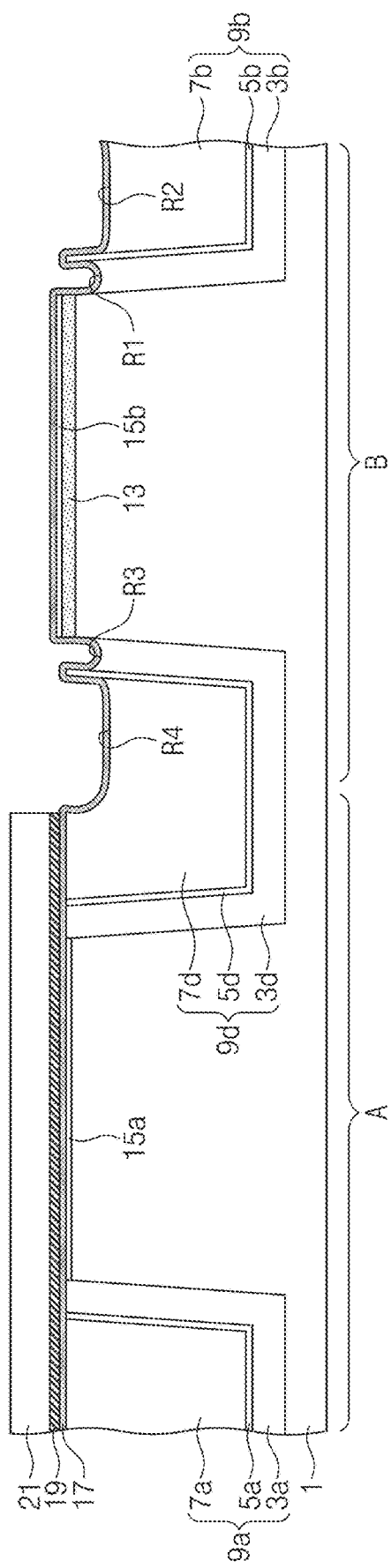

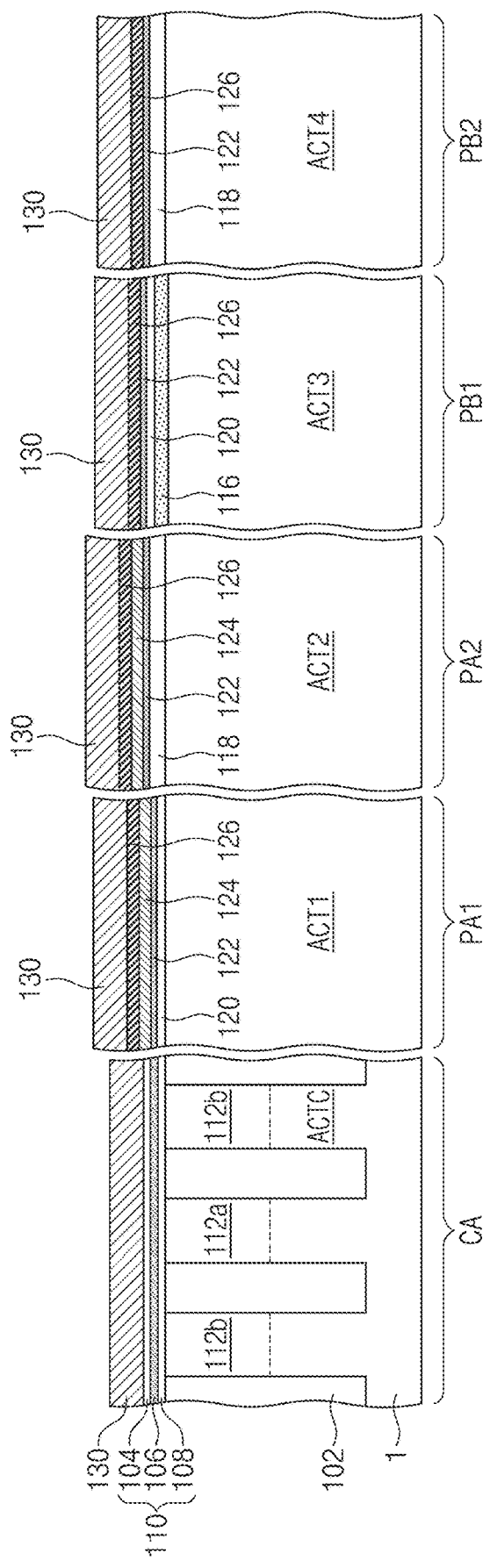

SEMICONDUCTOR DEVICE

CROSS-REFERENCE TO RELATED APPLICATIONS

This U.S. nonprovisional application is a Continuation of U.S. application Ser. No. 16/288,590, filed on Feb. 28, 2019, which is claims priority under 35 U.S.C § 119 to Korean Patent Application No. 10-2018-0047410 filed on Apr. 24, 2018 in the Korean Intellectual Property Office, the entire contents of each of which are hereby incorporated by reference.

BACKGROUND

Inventive concepts relate to a semiconductor device.

A semiconductor device includes a plurality of transistors. The transistors integrated in the semiconductor device are formed to have various structures based on required performances such as operating voltages and/or driving currents. For example, there has been developed a complementary metal oxide semiconductor (CMOS) device including an NMOS transistor and a PMOS transistor whose metal gate electrodes have different conductivity from each other. In addition, the CMOS device includes a gate dielectric layer whose thickness is different based on an applied voltage.

SUMMARY

Some embodiments of inventive concepts provide a semiconductor device with enhanced reliability.

According to some example embodiments of inventive concepts, a semiconductor device may comprise: a substrate comprising a first region and a second region; a first gate pattern on the substrate of the first region; and a second gate pattern on the substrate of the second region. The first gate pattern may comprise a first high-k dielectric pattern, a first N-type metal-containing pattern, and a first P-type metal-containing pattern that are sequentially stacked. The second gate pattern may comprise a second high-k dielectric pattern and a second P-type metal-containing pattern that are sequentially stacked.

According to some example embodiments of inventive concepts, a semiconductor device may comprise: a substrate comprising a cell array region, a first peripheral region, and a second peripheral region; a bit line running across the substrate on the cell array region; a buffer layer between the bit line and the substrate; a first peripheral gate pattern on the substrate of the first peripheral region; and a second peripheral gate pattern on the substrate of the second peripheral region. The first peripheral gate pattern may comprise a first high-k dielectric pattern, a first N-type metal-containing pattern, and a first P-type metal-containing pattern that are sequentially stacked. The second peripheral gate pattern may comprise a second high-k dielectric pattern and a second P-type metal-containing pattern that are sequentially stacked.

BRIEF DESCRIPTION OF THE DRAWINGS

FIGS. 2A to 2G illustrate cross-sectional views showing a method of fabricating the semiconductor device of FIG. 1A.

FIGS. 5A to 5L illustrate cross-sectional views showing a method of fabricating a semiconductor device having the cross-section of FIG. 4A.

DETAILED DESCRIPTION OF EMBODIMENTS

Some example embodiments of inventive concepts will now be described in detail with reference to the accompanying drawings to aid in clearly explaining inventive concepts.

Figure 1A:
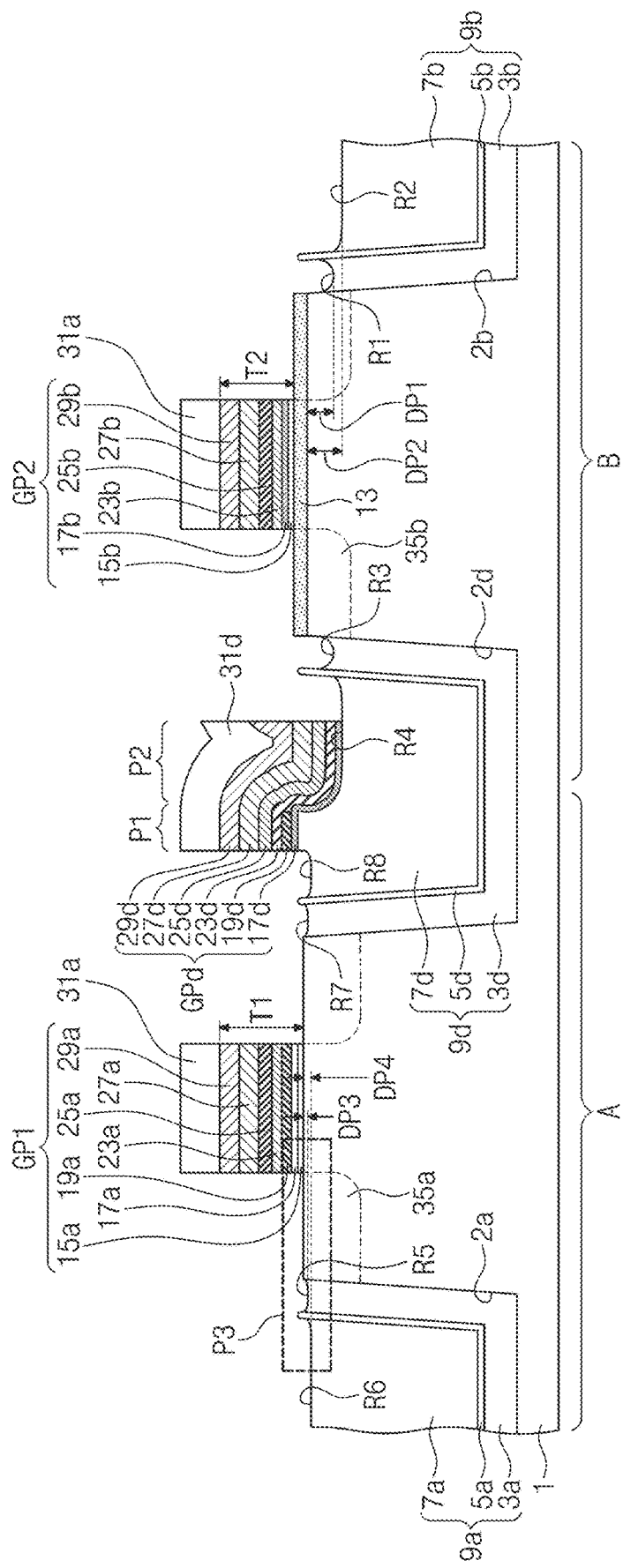
FIG. 1A illustrates a cross-sectional view showing a semiconductor device according to example embodiments of inventive concepts.
Figure 1B:
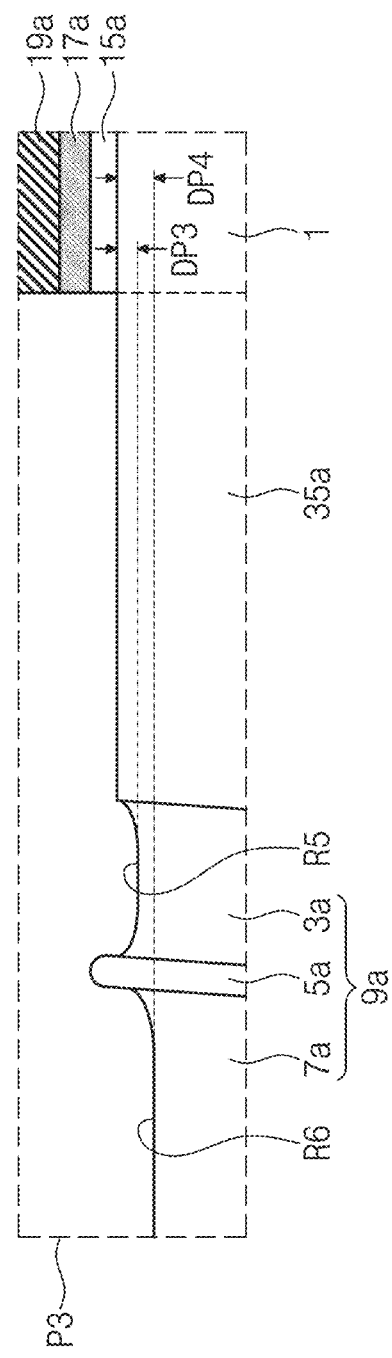
FIG. 1B illustrates an enlarged view showing section P3 of FIG. 1A.

FIG. 1A illustrates a cross-sectional view showing a semiconductor device according to example embodiments of inventive concepts. FIG. 1B illustrates an enlarged view showing section P3 of FIG. 1A.

Referring to FIG. 1A, a substrate 1 may be provided to include a first region A and a second region B. The substrate 1 may be or include, for example, a single crystalline silicon substrate or a silicon-on-insulator (SOI) substrate. The first region A may be an NMOS region. The second region B may be a PMOS region. A first trench 2a may be formed in the substrate 1 on the first region A. A second trench 2b may be formed in the substrate 1 on the second region B. A third trench 2d may be formed on a boundary between the first and second regions A and B. A first device isolation layer 9a, a second device isolation layer 9b, and/or a third device isolation layer 9d may be provided in the first trench 2a, the second trench 2b, and the third trench 2d, respectively.

The first device isolation layer 9a may include a first liner 3a conformally covering an inner wall of the first trench 2a, a first buried insulation layer 7a filing the first trench 2a, and/or a second liner 5a between the first liner 3a and the first buried insulation layer 7a. The second device isolation layer 9b may include a third liner 3b conformally covering an inner wall of the second trench 2b, a second buried insulation layer 7b filling the second trench 2b, and/or a fourth liner 5b between the third liner 3b and the second buried insulation layer 7b. The third device isolation layer 9d may include a fifth liner 3d conformally covering an inner wall of the third trench 2d, a third buried insulation layer 7d filling the third trench 2d, and/or a sixth liner 5d between the fifth liner 3d and the third buried insulation layer 7d. The first, third, and fifth liners 3a, 3b, and 3d may be formed of the same material, for example, a silicon oxide layer. The second, fourth, and sixth liners 5a, 5b, and 5d may be formed of the same material, for example, a silicon nitride layer. The first, second, and third buried insulation layers 7a, 7b, and 7d may be formed of the same material, for example, a silicon oxide layer.

On the first region A, a first gate pattern GP1 may be disposed on the substrate 1. First source/drain regions 35a may be disposed in the substrate 1 on opposite sides of the first gate pattern GP1. The first source/drain regions 35a may be doped with, for example, N-type impurities.

On the second region B, a channel layer 13 may be disposed on the substrate 1. The channel layer 13 may have a lattice constant greater than that of the substrate 1. For example, the channel layer 13 may be formed of silicon-germanium. The channel layer 13 may increase the hole mobility of PMOS transistors. In addition, the channel layer 13 may serve to reduce a work function. A second gate pattern GP2 may be disposed on the channel layer 13. Second source/drain regions 35b may be disposed in the channel layer 13 and the substrate 1 on opposite sides of the second gate pattern GP2. The second source/drain regions 35b may be doped with, for example, P-type impurities.

A dummy gate pattern GPd may be disposed on the boundary between the first and second regions A and B. The dummy gate pattern GPd may not actually operate, but may be formed to maintain an etching process condition regardless of the position of the substrate 1 and to reduce or prevent a loading effect. In addition, the dummy gate pattern GPd may be formed to reduce or prevent a dishing phenomenon that may occur when a chemical mechanical polishing (CMP) process is subsequently performed to form an interlayer dielectric layer.

The first gate pattern GP1 may include a first gate dielectric layer 15a, a first high-k dielectric pattern 17a, a first N-type metal-containing pattern 19a, a first diffusion barrier pattern 23a, a first P-type metal-containing pattern 25a, a first lower electrode 27a, and/or a first upper electrode 29a that are sequentially stacked. A first gate capping pattern 31a may be disposed on the first gate pattern GP1. The first N-type metal-containing pattern 19a may contact the first high-k dielectric pattern 17a. The first gate pattern GP1 may have a first thickness T1.

The second gate pattern GP2 may include a second gate dielectric layer 15b, a second high-k dielectric pattern 17b, a second diffusion barrier pattern 23b, a second P-type metal-containing pattern 25b, a second lower electrode 27b, and/or a second upper electrode 29b that are sequentially stacked. A second gate capping pattern 31b may be disposed on the second gate pattern GP2. The second P-type metal-containing pattern 25b may be adjacent to the second high-k dielectric pattern 17b. The second gate pattern GP2 may exclude, or not include, the N-type metal-containing pattern 19a. The second gate pattern GP2 may have a second thickness T2. Since the second gate pattern GP does not include the N-type metal-containing pattern 19a, the second thickness T2 may be less than the first thickness T1.

A dummy gate capping pattern 31d may be disposed on the dummy gate pattern GPd. The dummy gate pattern GPd may include a first segment P1 adjacent to the first region A and a second segment P2 adjacent to the second region B. The dummy gate pattern GPd may be configured such that the first segment P1 may have a bottom surface higher than that of the second segment P2. The first segment P1 of the dummy gate pattern GPd may include a dummy high-k dielectric pattern 17d, a dummy N-type metal-containing pattern 19d, a dummy diffusion barrier pattern 23d, a dummy P-type metal-containing pattern 25d, a dummy lower electrode 27d, and/or a dummy upper electrode 29d that are sequentially stacked. The second segment P2 of the dummy gate pattern GPd may be configured identically to the first segment P1, except that the dummy N-type metal-containing pattern 19d is excluded. On the second segment P2, the dummy diffusion barrier pattern 23d may contact the dummy high-k dielectric pattern 17d. The dummy diffusion barrier pattern 23d may contact a lateral surface of the dummy N-type metal-containing pattern 19d. On the second segment P2, the dummy upper electrode 29d and the dummy gate capping pattern 31d may be partially recessed on their top surfaces.

The first and second gate dielectric layers 15a and 15b may be formed of, for example, a silicon oxide layer or a silicon oxynitride layer. The first high-k dielectric pattern 17a, the second high-k dielectric pattern 17b, and the dummy high-k dielectric pattern 17d may be formed of a material whose dielectric constant is greater than that of a silicon oxide layer, which material may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the first high-k dielectric pattern 17a, the second high-k dielectric pattern 17b, and the dummy high-k dielectric pattern 17d may be formed of $HfO_2$, $Al_2O_3$, $HfAlO_3$, $Ta_2O_3$, or $TiO_2$. The first N-type metal-containing pattern 19a and the dummy N-type metal-containing pattern 19d may be formed of a metal-containing layer having an N work function. For example, the first N-type metal-containing pattern 19a and the dummy N-type metal-containing pattern 19d may include at least one of lanthanum (La), lanthanum oxide (LaO), tantalum (Ta), tantalum nitride (TaN), niobium (Nb), and titanium nitride (TiN). For detailed example, each of the first N-type metal-containing pattern 19a and the dummy N-type metal-containing pattern 19d may include a lanthanum layer and a titanium nitride layer that are sequentially stacked, or a lanthanum oxide layer and a titanium nitride layer that are sequentially stacked.

The first P-type metal-containing pattern 25a, the second P-type metal-containing pattern 25b, and the dummy P-type metal-containing pattern 25d may be formed of a metal-containing layer having a P work function. For example, the first P-type metal-containing pattern 25a, the second P-type metal-containing pattern 25b, and the dummy P-type metal-containing pattern 25d may include at least one of aluminum (Al), aluminum oxide ($Al_2O_3$), titanium nitride (TiN), tungsten nitride (WN), and ruthenium oxide ($RuO_2$). For detailed example, each of the first P-type metal-containing pattern 25a, the second P-type metal-containing pattern 25b, and the dummy P-type metal-containing pattern 25d may include an aluminum oxide layer and a titanium nitride layer that are sequentially stacked, or an aluminum oxide layer and a titanium nitride layer that are sequentially stacked.

The first diffusion barrier pattern 23a, the second diffusion barrier pattern 23b, and the dummy diffusion barrier pattern 23d may be formed of, for example, a titanium nitride layer, a tungsten nitride layer, or a tantalum nitride layer. The first diffusion barrier pattern 23a, the second diffusion barrier pattern 23b, and the dummy diffusion barrier pattern 23d may reduce or prevent diffusion of aluminum included in the first P-type metal-containing pattern 25a, the second P-type metal-containing pattern 25b, and/or the dummy P-type metal-containing pattern 25d. When there is no need to reduce or prevent diffusion of materials included in the first P-type metal-containing pattern 25a, the second P-type metal-containing pattern 25b, and the dummy P-type metal-containing pattern 25d, it may be possible to exclude the first diffusion barrier pattern 23a, the second diffusion barrier pattern 23b, and the dummy diffusion barrier pattern 23d. In this case, on the first region A, the first P-type metal-containing pattern 25a may contact the first N-type metal-containing pattern 19a. In addition, on the second region B, the second P-type metal-containing pattern 25b may contact the second high-k dielectric pattern 17b.

The first lower electrode 27a, the second lower electrode 27b, and the dummy lower electrode 27d may include polysilicon doped with impurities. The impurities doped in the first lower electrode 27a may have a different conductivity from that of the impurities doped in the second lower electrode 27b. For example, the first lower electrode 27a may be doped with N-type impurities, and the second lower electrode 27b may be doped with P-type impurities.

The first upper electrode 29a, the second upper electrode 29b, and the dummy upper electrode 29d may include at least one of a metal silicide layer, a metal nitride layer, and a metal-containing layer. The metal silicide layer may include, for example, cobalt silicide or tungsten silicide. The metal nitride layer may be or include, for example, a titanium nitride layer or a tantalum nitride layer. The metal-containing layer may include, for example, one of tungsten, aluminum, and copper.

The first gate capping pattern 31a, the second gate capping pattern 31b, and the dummy gate capping pattern 31d may be formed of, for example, a silicon nitride layer.

The second device isolation layer 9b may be configured such that the fourth liner 5b may have a top end that protrudes beyond those of the third liner 3b and the second buried insulation layer 7b. The third liner 3b may have a first recess R1 on its upper portion. The second buried insulation layer 7b may have a second recess R2 on its upper portion. A first depth DP1 from a bottom surface of the second gate pattern GP2 to a lowest point of the first recess R1 may be less than a second depth DP2 from the bottom surface of the second gate pattern GP2 to a lowest point of the second recess R2.

The third device isolation layer 9d may be configured such that the sixth liner 5d may have a top end that protrudes beyond those of the fifth liner 3d and the third buried insulation layer 7d. The fifth liner 3d may have a third recess R3 on its upper portion adjacent to the second segment P2 of the dummy gate pattern GPd. The third buried insulation layer 7d may have a fourth recess R4 on its upper portion adjacent to the second segment P2 of the dummy gate pattern GPd. A depth from the bottom surface of the second gate pattern GP2 to a lowest point of the third recess R3 may correspond to, or be the same as, the first depth DP1. A depth from the bottom surface of the second gate pattern GP2 to a lowest point of the fourth recess R4 may correspond to, or be the same as, the second depth DP2.

Referring to FIG. 1B, the first device isolation layer 9a may be configured such that the second liner 5a may have a top end that protrudes beyond those of the first liner 3a and the first buried insulation layer 7a. The first liner 3a may have a fifth recess R5 on its upper portion. The first buried insulation layer 7a may have a sixth recess R6 on its upper portion. A third depth DP3 from a bottom surface of the first gate pattern GP1 to a lowest point of the fifth recess R5 may be less than a fourth depth DP4 from the bottom surface of the first gate pattern GP1 to a lowest point of the sixth recess R6.

Referring back to FIG. 1A, the first depth DP1 may be greater than the third depth DP3. The second depth DP2 may be greater than the fourth depth DP4. The first depth DP1 may be greater than the fourth depth DP4.

The fifth liner 3d may have a seventh recess R7 on its upper portion adjacent to the first segment P1 of the dummy gate pattern GPd. The third buried insulation layer 7d may have an eighth recess R8 on its upper portion adjacent to the first segment P1 of the dummy gate pattern GPd. A depth from the bottom surface of the first gate pattern GP1 to a lowest point of the seventh recess R7 may correspond to, or be the same as, the third depth DP3. A depth from the bottom surface of the first gate pattern GP1 to a lowest point of the eighth recess R8 may correspond to, or be the same as, the fourth depth DP4.

FIGS. 2A to 2G illustrate cross-sectional views showing a method of fabricating the semiconductor device of FIG. 1A.

Figure 2A:
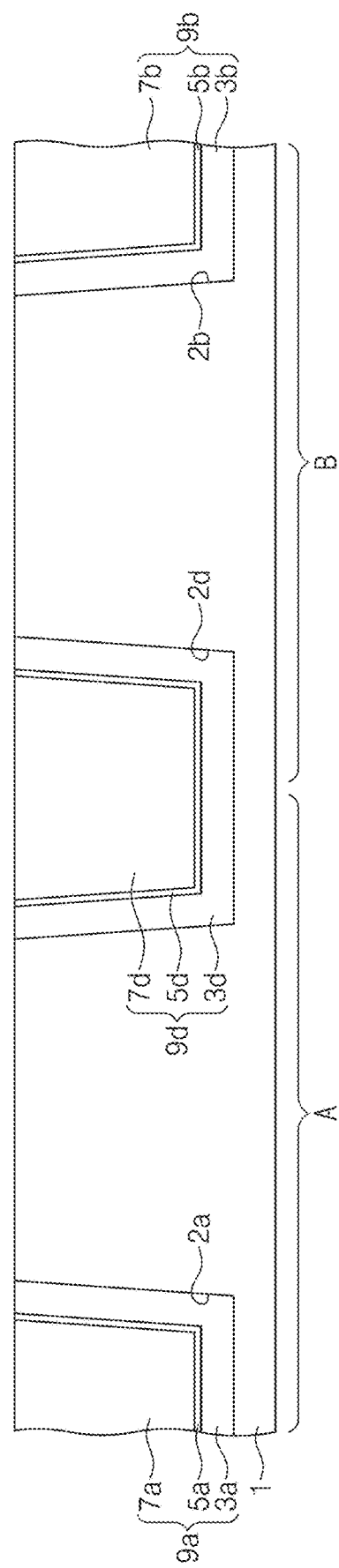

Referring to FIG. 2A, a substrate 1 may be prepared to include a first region A and a second region B. The substrate 1 may be etched to form first, second, and third trenches 2a, 2b, and 2d. A first liner layer and a second liner layer may be conformally formed on an entire surface of the substrate 1. A buried insulation layer may be formed to fill the first, second, and third trenches 2a, 2b, and 2d. A chemical mechanical polishing (CMP) process may be performed to respectively form first, second, and third device isolation layers 9a, 9b, and 9d in the first, second, and third trenches 2a, 2b, and 2d.

The first device isolation layer 9a may include a first liner 3a conformally covering an inner wall of the first trench 2a, a first buried insulation layer 7a filling the first trench 2a, and a second liner 5a between the first liner 3a and the first buried insulation layer 7a. The second device isolation layer 9b may include a third liner 3b conformally covering an inner wall of the second trench 2b, a second buried insulation layer 7b filling the second trench 2b, and a fourth liner 5b between the third liner 3b and the second buried insulation layer 7b. The third device isolation layer 9d may include a fifth liner 3d conformally covering an inner wall of the third trench 2d, a third buried insulation layer 7d filling the third trench 2d, and a sixth liner 5d between the fifth liner 3d and the third buried insulation layer 7d.

Figure 2B:
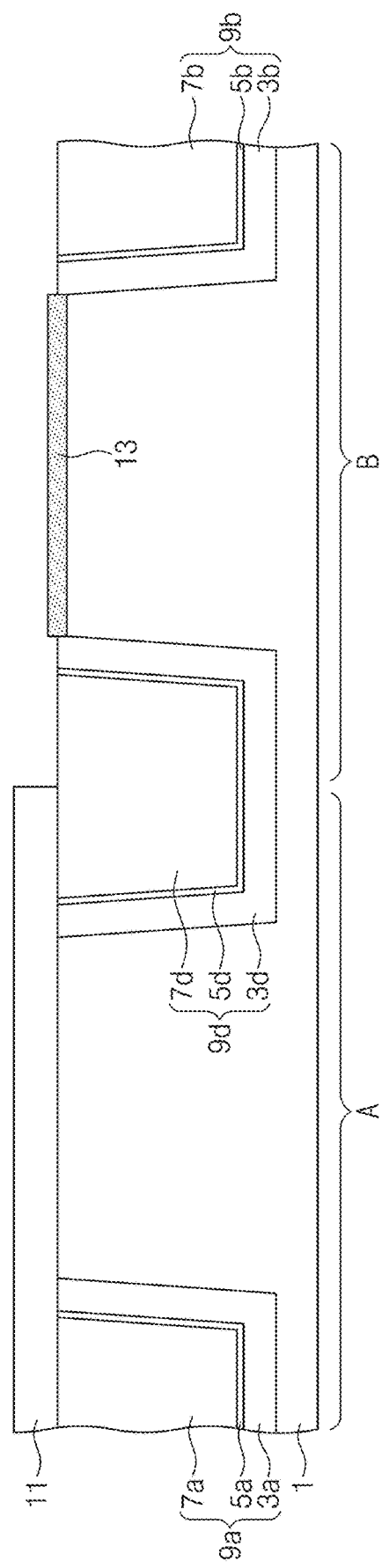

Referring to FIG. 2B, a first mask layer 11 may be formed to cover the first region A and to expose the second region B. The first mask layer 11 may be formed of, for example, a silicon oxide layer. The first mask layer 11 may cover a portion of the third device isolation layer 9d and exposes other portions of the third device isolation layer 9d. The first mask layer 11 may be used as an epitaxial barrier to form a channel layer 13 on a top surface of the substrate 1 exposed on the second region B. The channel layer 13 may be formed by, for example, selective epitaxial growth (SEG). The channel layer 13 may include silicon-germanium. The channel layer 13 may not be formed on the first, second, and third device isolation layers 9a, 9b, and 9d.

Figure 2C:
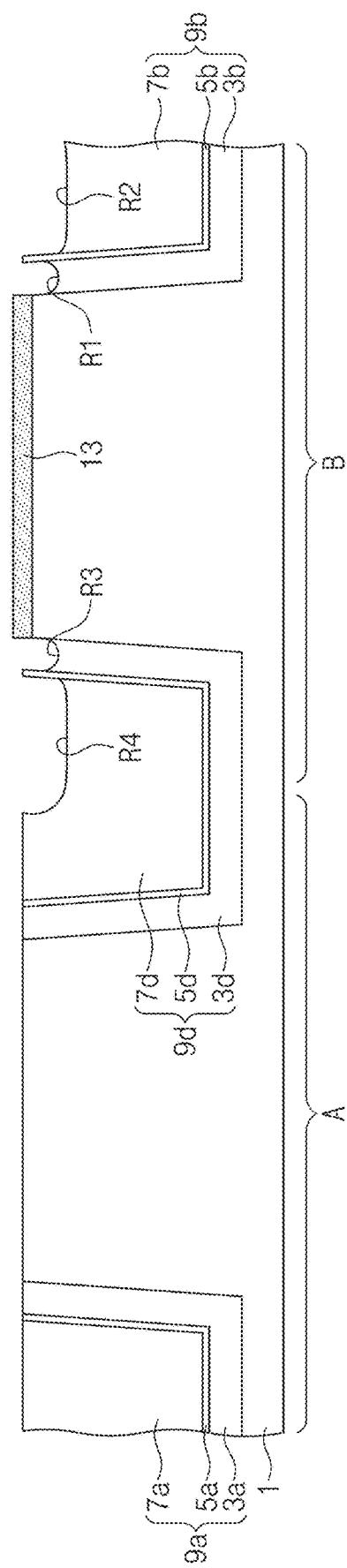

Referring to FIG. 2C, the first mask layer 11 may be removed. For example, a wet etching process may be performed to remove the first mask layer 11. When the first mask layer 11 is formed of a silicon oxide layer, the wet etching process may use, for example, fluoric acid as an etchant. When the first mask layer 11 is removed, the second and third device isolation layers 9b and 9d may also be etched on their upper portions exposed on the second region B. For example, etching may be performed on upper portions of the third liner 3b, the second buried insulation layer 7b, the fifth liner 3d, and the third buried insulation layer 7d that can be formed of the same material. Accordingly, a first recess R1 may be formed on the third liner 3b. A second recess R2 may be formed on the second buried insulation layer 7b. A third recess R3 may be formed on the fifth liner 3d. A fourth recess R4 may be formed on the third buried insulation layer 7d. The third and fifth liners 3b and 3d may have relatively narrow widths such that etchant attack may be difficult, while the second and third buried insulation layers 7b and 7d may have relatively wide exposed areas such that the etchant attack may be easier. Therefore, each of the first and third recesses R1 and R3 may be formed to have a depth (e.g., the first depth DP1 of FIG. 1) less than that (e.g., the second depth DP2 of FIG. 1) of each of the second and fourth recesses R2 and R4. When the first mask layer 11 is etched, the fourth and sixth liners 5b and 5d may not be etched due to etch resistance caused by their material different from that of the first mask layer 11. As a result, the fourth and sixth liners 5b and 5d may have top ends that protrude beyond the third liner 3b, the fifth liner 3d, the second buried insulation layer 7b, and the third buried insulation layer 7d.

Figure 2D:
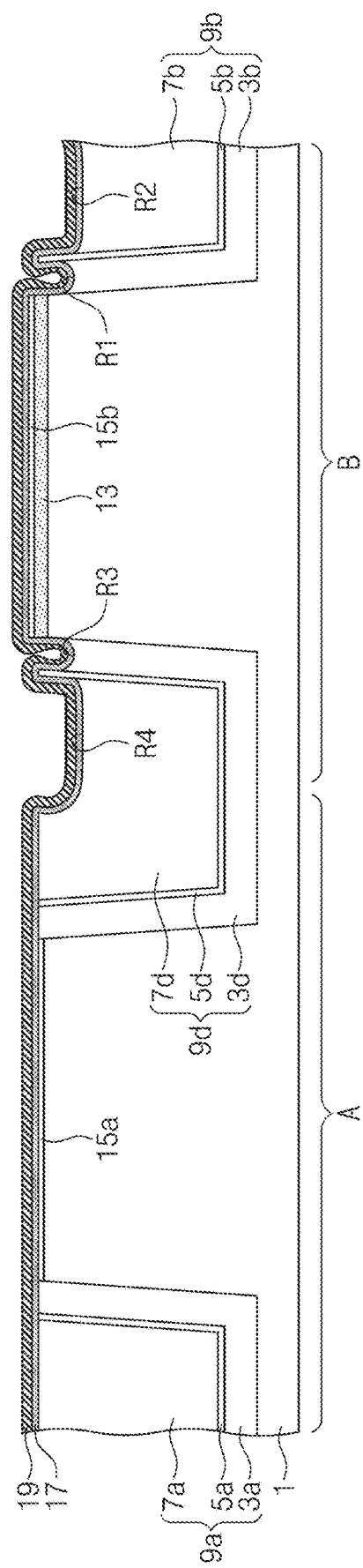

Referring to FIG. 2D, on the first region A, a first gate dielectric layer 15a may be formed on the substrate 1, and on the second region B, a second gate dielectric layer 15b may be formed on the channel layer 13. The first and second gate dielectric layers 15a and 15b may be simultaneously formed by a thermal oxidation process or a deposition process. The first and second gate dielectric layers 15a and 15b may be formed of, for example, a silicon oxide layer or a silicon oxynitride layer. Although not shown, before the first and second gate dielectric layers 15a and 15b are formed, a cleaning process may be performed on a surface of the substrate 1. The cleaning process may partially etch surfaces of the first, second, and third device isolation layers 9a, 9b, and 9d. A high-k dielectric layer 17 may be conformally formed on the entire surface of the substrate 1. An N-type metal-containing layer 19 may be conformally formed on the high-k dielectric layer 17. The N-type metal-containing layer 19 may be difficult to deposit in the first and third recesses R1 and R3, and thus may have a relatively small thickness in the first and third recesses R1 and R3. The N-type metal-containing layer 19 may be or include a metal-containing layer having an N work function.

The N-type metal-containing layer 19 may include at least one of lanthanum (La), lanthanum oxide (LaO), tantalum (Ta), tantalum nitride (TaN), niobium (Nb), and titanium nitride (TiN). For example, the N-type metal-containing layer 19 may include a lanthanum layer and a titanium nitride layer that are sequentially stacked, or a lanthanum oxide layer and a titanium nitride layer that are sequentially stacked.

Referring to FIG. 2E, a second mask layer 21 may be formed on the N-type metal-containing layer 19, covering the first region A and exposing the second region B. The second mask layer 21 may be formed of at least one of a photoresist layer, an amorphous carbon layer (ACL), a spin-on-hardmask (SOH) layer, a spin-on-carbon (SOC) layer, and a silicon nitride layer. The second mask layer 21 may be used as an etching mask to etch the N-type metal-containing layer 19 on the second region B, which may result in exposing the high-k dielectric layer 17. The N-type metal-containing layer 19 may be etched by a wet etching process that uses an etchant including, for example, sulfuric acid. In comparison with a dry etching process, the wet etching process may remarkably reduce etching damages to the high-k dielectric layer 17 and selectively remove the N-type metal-containing layer 19 from the second region B.

Figure 2F:
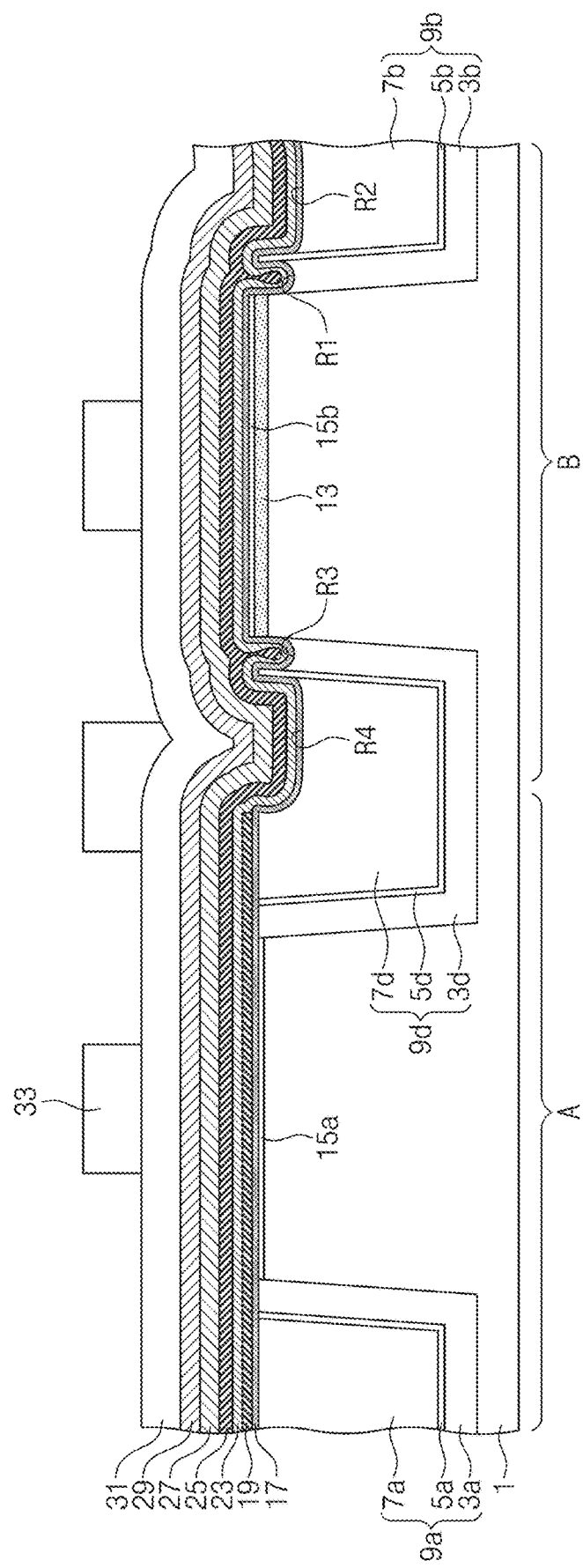

Referring to FIG. 2F, the second mask layer 21 may be removed. A diffusion barrier layer 23, a P-type metal-containing layer 25, a lower electrode layer 27, an upper electrode layer 29, and a capping layer 31 may be sequentially stacked on the entire surface of the substrate 1. The diffusion barrier layer 23 may be or include at least one of a titanium nitride layer, a tungsten nitride layer, and a tantalum nitride layer. The P-type metal-containing layer 25 may be or include a metal-containing layer having a P work function. For example, the P-type metal-containing layer 25 may include at least one of aluminum (Al), aluminum oxide ($Al_2O_3$), titanium nitride (TiN), tungsten nitride (WN), and ruthenium oxide ($RuO_2$). For detailed example, the P-type metal-containing layer 25 may include an aluminum oxide layer and a titanium nitride layer that are sequentially stacked, or an aluminum oxide layer and a titanium nitride layer that are sequentially stacked.

The lower electrode layer 27 may be formed of an impurity-doped polysilicon layer. The formation of the lower electrode layer 27 may include depositing a polysilicon layer, doping N-type impurities into the lower electrode layer 27 on the first region A, and doping P-type impurities into the lower electrode layer 27 on the second region B.

Third mask patterns 33 may be formed on the capping layer 31. The third mask patterns 33 may limit or define shapes of a first gate pattern GP1, a second gate pattern GP2, and a dummy gate pattern GPd which will be discussed below. The third mask patterns 33 may be formed of a photoresist layer, an amorphous carbon layer (ACL), a spin-on-hardmask (SOH) layer, or a spin-on-carbon (SOC) layer.

Figure 2G:
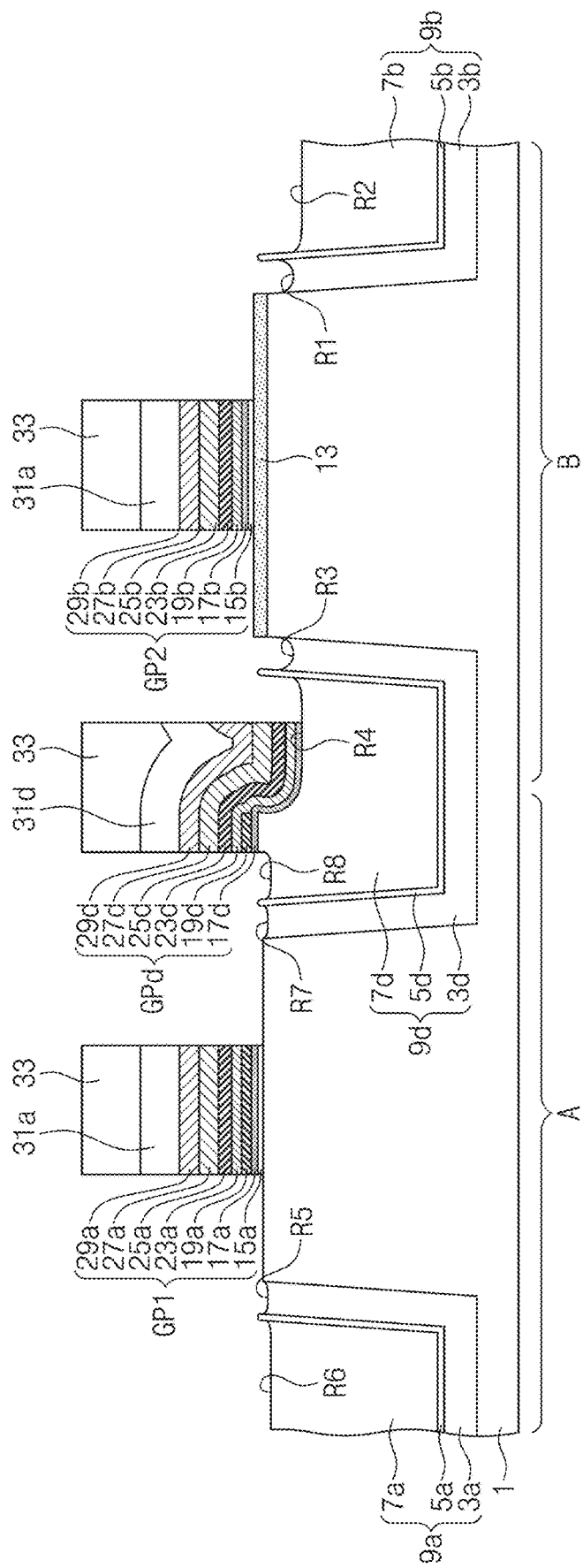

Referring to FIG. 2G, on the first region A, the third mask patterns 33 may be used as an etching mask to successively etch the capping layer 31, the upper electrode layer 29, the lower electrode layer 27, the P-type metal-containing layer 25, the diffusion barrier layer 23, the N-type metal-containing layer 19, the high-k dielectric layer 17, and the first gate dielectric layer 15a, which may result in the formation of a first gate pattern GP1. On the second region B, the third mask patterns 33 may be used as an etching mask to successively etch the capping layer 31, the upper electrode layer 29, the lower electrode layer 27, the P-type metal-containing layer 25, the diffusion barrier layer 23, the high-k dielectric layer 17, and the second gate dielectric layer 15b, which may result in the formation of a second gate pattern GP2. On the first and second regions A and B, the third mask patterns 33 may be used as an etching mask to successively etch the capping layer 31, the upper electrode layer 29, the lower electrode layer 27, the P-type metal-containing layer 25, the diffusion barrier layer 23, the N-type metal-containing layer 19, and the high-k dielectric layer 17, which may result in the formation of a dummy gate pattern GPd. The first and second gate patterns GP1 and GP2 and the dummy gate pattern GPd may be formed at the same time. In this operation, the first device isolation layer 9a may also be partially etched and the third device isolation layer 9d may also be etched on its portion that is positioned on the first region A, which partial etching may form fifth, sixth, seventh, and eighth recesses R5, R6, R7, and R8.

Since the first and third recesses R1 and R3 are relatively narrow and deep, when a metal-containing layer has an increased thickness in the first and third recesses R1 and R3, it may be difficult to completely remove the metal-containing layer during the etching process of FIG. 2G. If the N-type metal-containing layer 19 is not removed from the second region B in the operation of FIG. 2E, the presence of the N-type metal-containing layer 19 on the second region B may cause the first and third recesses R1 and R3 to have the N-type metal-containing layer 19 therein. In this case, an over-etching may be required to remove the N-type metal-containing layer 19 from the first and third recesses R1 and R3 during the etching process of FIG. 2G, and thus the substrate 1 on the first region A may suffer from etching damages. However, according to inventive concepts, the N-type metal-containing layer 19 may be removed in advance from the second region B, it may be possible to reduce a process burden on the etching process of FIG. 2G. It may also be possible to decrease the probability of the presence of metal residues in the first and third recesses R1 and R3. As a result, a semiconductor device may be fabricated to have enhanced reliability.

Figure 3:
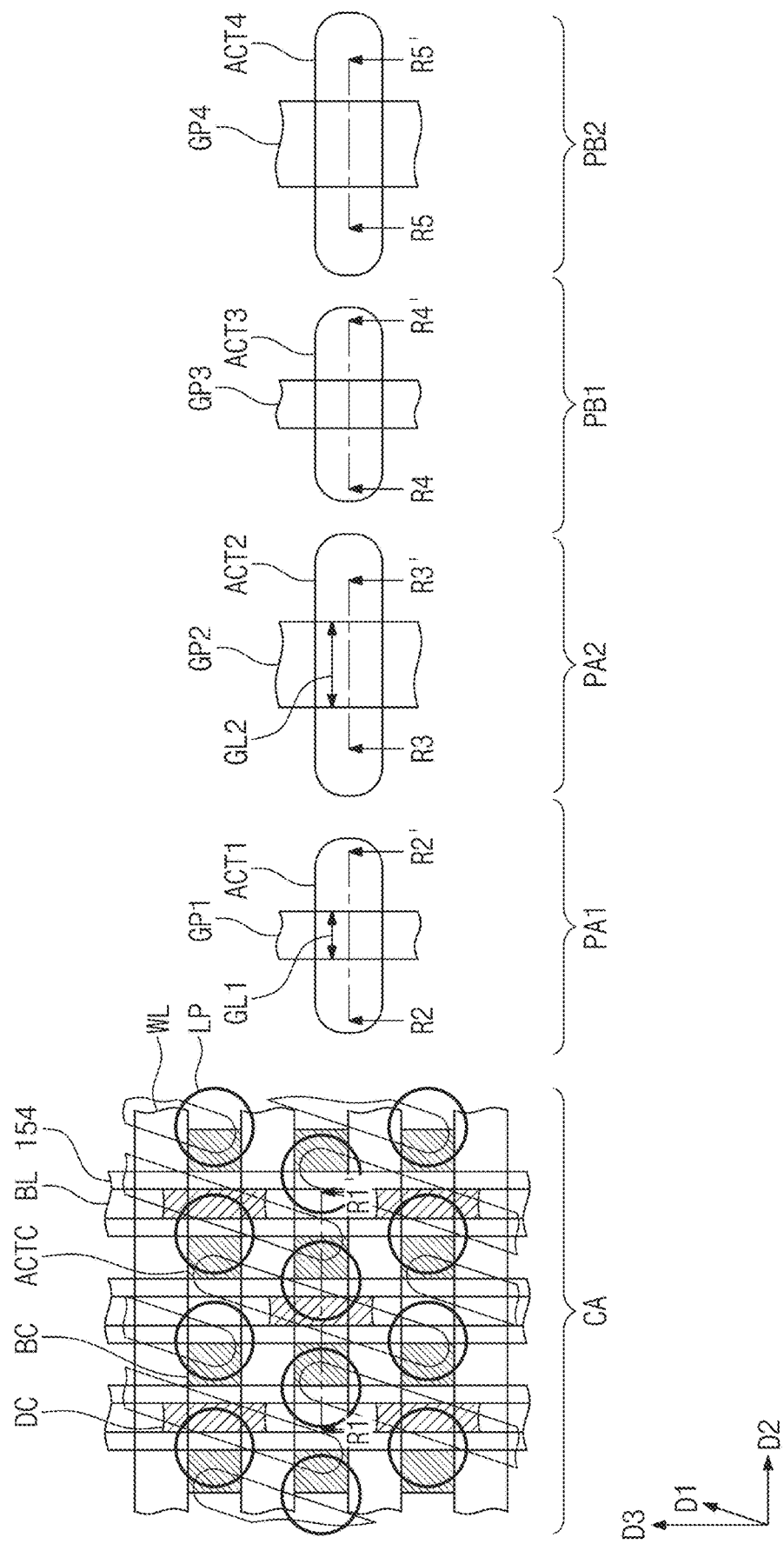
FIG. 3 illustrates a plan view showing a semiconductor device according to example embodiments of inventive concepts.
Figure 4A:
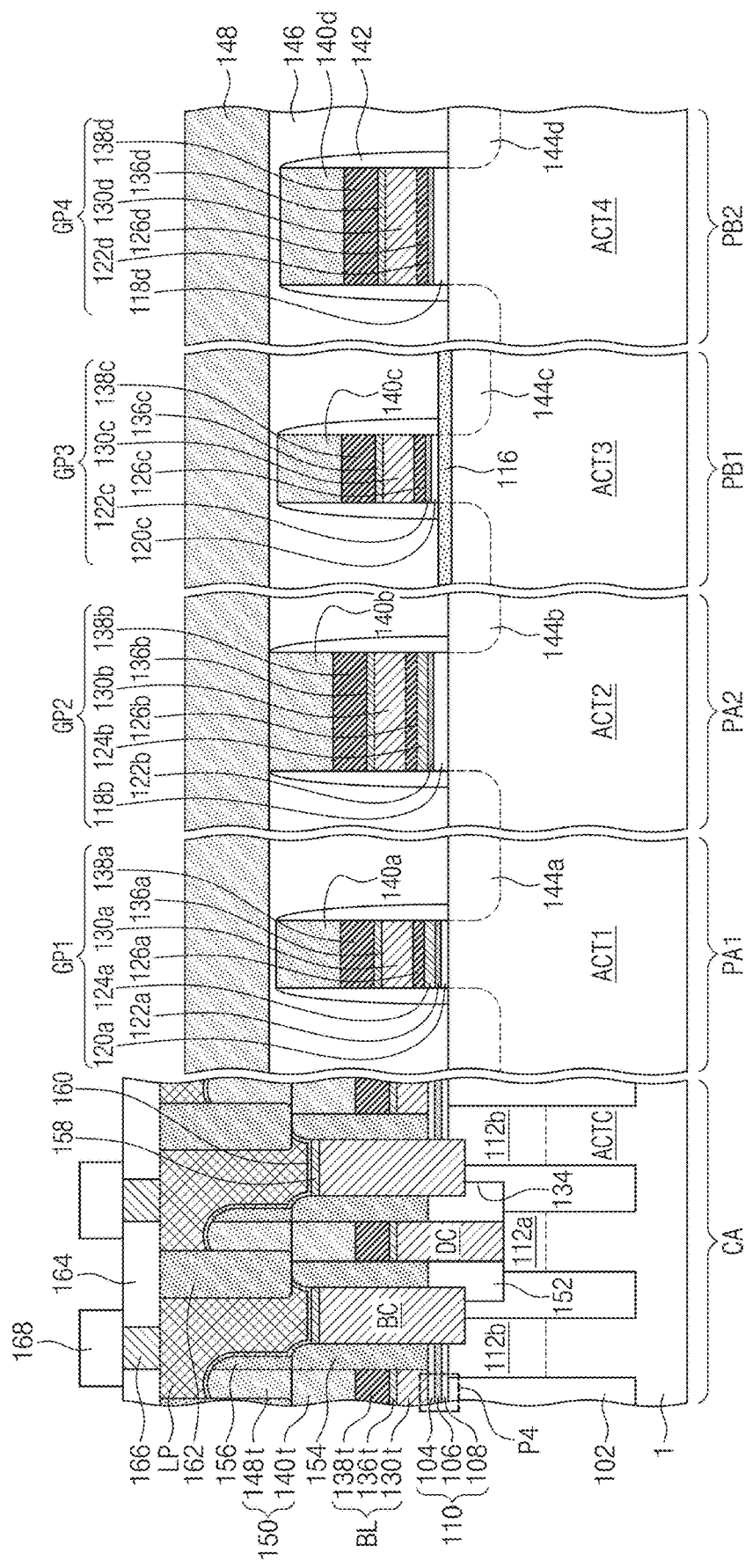
FIG. 4A illustrates a cross-sectional view taken along lines R1-R1', R2-R2', R3-R3', R4-R4', and R5-R5' of FIG. 3.
Figure 4B:
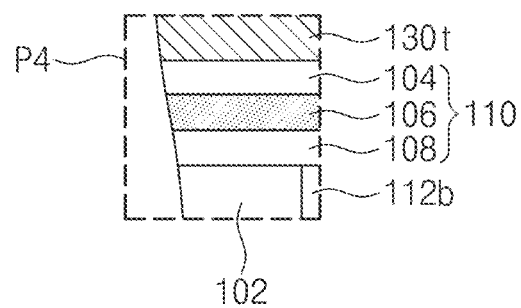
FIG. 4B illustrates an enlarged view showing section P4 of FIG. 4A.

FIG. 3 illustrates a plan view showing a semiconductor device according to example embodiments of inventive concepts. FIG. 4A illustrates a cross-sectional views taken along lines R1-R1', R2-R2', R3-R3', R4-R4', and R5-R5' of FIG. 3. FIG. 4B illustrates an enlarged view showing section P4 of FIG. 4A.

Referring to FIGS. 3 and 4A, a substrate 1 may be provided to include a cell array region CA, a first peripheral region PA1, a second peripheral region PA2, a third peripheral region PB1, and/or a fourth peripheral region PB2. The first, second, third, and fourth peripheral regions PA1, PA2, PB1, and PB2 may be disposed around the cell array region CA. The first, second, third, and/or fourth peripheral regions PA1, PA2, PB1, and PB2 may be provided with peripheral circuits for driving word lines WL and bit lines BL disposed on the cell array region CA. The first peripheral region PA1 may be provided thereon with, for example, an NMOS low-voltage transistor. The second peripheral region PA2 may be provided thereon with, for example, an NMOS high-voltage transistor. The third peripheral region PB1 may be provided thereon with, for example, a PMOS low-voltage transistor. The fourth peripheral region PB2 may be provided thereon with, for example, a PMOS high-voltage transistor.

On the cell array region CA, the substrate 1 may be provided therein with a cell device isolation layer 102 defining cell active sections ACTC. Each of the cell active sections ACTC may have an isolated shape. When viewed in plan, each of the cell active sections ACTC may have a bar shape elongated along a first direction D1. The substrate 1 may be or include a single crystalline silicon substrate or a silicon-on-insulator (SOI) substrate. As discussed with reference to FIG. 1A, the cell device isolation layer 102 may include an oxide liner, a nitride liner, and a buried insulation layer. The cell active sections ACTC may be arranged in parallel to each other in the first direction D1 such that one of the cell active sections ACTC may have an end adjacent to a center of a neighboring one of the cell active sections ACTC.

The word lines WL may run across the cell active sections ACTC. The word lines WL may be disposed in grooves formed in the cell device isolation layer 102 and the cell active sections ACTC. The word lines WL may be parallel to a second direction D2 intersecting the first direction D1. The word lines WL may be buried within the substrate 1.

A first doped region 112a may be disposed in the cell active section ACTC between a pair of the word lines WL, and a pair of second doped regions 112b may be disposed in opposite edge portions of the cell active section ACTC. The first and second doped regions 112a and 112b may be doped with, for example, N-type impurities. The first doped region 112a may correspond to a common drain region, and the second doped regions 112b may correspond to source regions.

Referring to FIGS. 4A and 4B, on the cell array region CA, a buffer layer 110 may be disposed on the substrate 1. The buffer layer 110 may include a first insulation layer 108, a second insulation layer 106, and/or a third insulation layer 104 that are sequentially stacked. The second insulation layer 106 may be formed of a material exhibiting an etch selectivity to the first and third insulation layers 108 and 104. For example, the second insulation layer 106 may be formed of a silicon nitride layer. The first and third insulation layers 108 and 104 may be formed of a silicon oxide layer.

The bit lines BL may be disposed on the buffer layer 110. The bit lines BL may run across the word lines WL. As shown in FIG. 3, the bit lines BL may be parallel to a third direction D3 intersecting the first and second directions D1 and D2. Each of the bit lines BL may include a bit line lower electrode 130t, a bit line diffusion barrier pattern 136t, and/or a bit line upper electrode 138t that are sequentially stacked. The bit line lower electrode 130t may include impurity-doped polysilicon. The bit line diffusion barrier pattern 136t may be formed of, for example, a titanium nitride layer, a tungsten nitride layer, or a tantalum nitride layer. The bit line upper electrode 138t may be or include one of aluminum, tungsten, and copper. A bit line capping pattern 150 may be disposed on the bit line BL. The bit line capping pattern 150 may include a first bit line capping pattern 140t and a second bit line capping pattern 148t that are sequentially stacked. The first and second bit line capping patterns 140t and 148t may be formed of, for example, a silicon nitride layer.

A first bit line spacer 154 may cover a sidewall of the bit line BL and a lower sidewall of the bit line capping pattern 150. A second bit line spacer 156 may cover an upper sidewall of the bit line capping pattern 150. Each of the first and second bit line spacers 154 and 156 may have a single layered structure or a multi-layered structure including at least one of a silicon nitride layer, a silicon oxide layer, and a silicon oxynitride layer. The second bit line spacer 156 may include an air gap therein. The second bit line spacer 156 may have a width less than that of the first bit line spacer 154. In such a configuration, an interval between the first bit line spacers 154 may become wide between upper portions of the bit line capping patterns 150. As a result, an easy connection may be possible between a landing pad LP and a storage node contact BC which will be discussed below.

The buffer layer 110 may be interposed between the bit line BL and the cell device isolation layer 102 and between the first bit line spacer 154 and the substrate 1. The first bit line spacer 154 may have a sidewall aligned with that of the buffer layer 110.

The bit line BL may be electrically connected to the first doped region 112a through a bit line contact DC. The bit line contact DC may be formed of, for example, impurity-doped polysilicon. A recess region 134 may be formed on an upper portion of the first doped region 112a and an upper portion of the cell device isolation layer 102 adjacent to the first doped region 112a. The bit line contact DC may be disposed in the recess region 134. A buried insulation pattern 152 may fill a space between a lower sidewall of the bit line contact DC and an inner wall of the recess region 134. The buried insulation pattern 152 may have a single-layered structure or a multi-layered structure including at least one of a silicon nitride layer and a silicon oxide layer.

Storage node contacts BC may be disposed between a pair of neighboring bit lines BL. The storage node contacts BC may be spaced apart from each other. The storage node contacts DC may include impurity-doped polysilicon. When viewed in plan, the storage node contacts BC may have island shapes spaced apart from each other. The storage node contacts BC may penetrate the buffer layer 110 and contact the second doped regions 112b.

A storage node ohmic layer 158 may be disposed on the storage node contact BC. The storage node ohmic layer 158 may include metal silicide. For example, the storage node ohmic layer 158 may be or include cobalt silicide. A landing pad diffusion barrier pattern 160 may conformally cover the storage node ohmic layer 158, the first and second bit line spacers 154 and 156, and the bit line capping pattern 150. The landing pad diffusion barrier pattern 160 may be formed of, for example, at least one of a titanium nitride layer, a tungsten nitride layer, and a tantalum nitride layer.

A landing pad LP may be disposed on the landing pad diffusion barrier pattern 160. The landing pad LP may be formed of a material containing metal, such as tungsten, aluminum, or copper. The landing pad LP may have an upper portion that covers a top surface of the bit line capping pattern 150 and has a width greater than that of the storage node contact BC. A center of the landing pad LP may shift from a center of the storage node contact BC in a reverse direction to the second direction D2. A portion of the bit line BL may vertically overlap the landing pad LP.

A landing pad separation pattern 162 may separate neighboring landing pads LP from each other. The landing pad separation pattern 162 may have a single-layered structure or a multi-layered structure including at least one of a silicon nitride layer, a silicon oxide layer, and a silicon carbonitride layer. The landing pad separation pattern 162 may penetrate the second bit line spacer 156 and contact the first bit line spacer 154.

A cell interlayer dielectric layer 164 may be disposed on the landing pads LP and the landing pad separation pattern 162. The cell interlayer dielectric layer 164 may include a silicon oxide layer. A data storage element 168 may be disposed on the cell interlayer dielectric layer 164. The data storage element 168 may be or include a capacitor, a phase change material pattern, a variable resistance material pattern, or a magnetic tunnel junction pattern. The data storage element 168 may be electrically connected to the landing pad LP through a cell contact 166 penetrating the cell interlayer dielectric layer 164.

On the first peripheral region PA1, a peripheral device isolation layer (not shown) may define a first peripheral active section ACT1. On the first peripheral region PA1, a first peripheral gate pattern GP1 may be disposed on the substrate 1. The first peripheral gate pattern GP1 may include a first peripheral gate dielectric pattern 120*a*, a first peripheral high-k dielectric pattern 122*a*, a first N-type metal-containing pattern 124*a*, a first P-type metal-containing pattern 126*a*, a first peripheral lower electrode 130*a*, a first peripheral diffusion barrier pattern 136*a*, and/or a first peripheral upper electrode 138*a* that are sequentially stacked. The first N-type metal-containing pattern 124*a* may contact the first P-type metal-containing pattern 126*a*. A first peripheral gate capping pattern 140*a* may be disposed on the first peripheral gate pattern GP1.

On the second peripheral region PA2, a peripheral device isolation layer (not shown) may define a second peripheral active section ACT2. On the second peripheral region PA2, a second peripheral gate pattern GP2 may be disposed on the substrate 1. The second peripheral gate pattern GP2 may include a second peripheral gate dielectric pattern 118*b*, a second peripheral high-k dielectric pattern 122*b*, a second N-type metal-containing pattern 124*b*, a second P-type metal-containing pattern 126*b*, a second peripheral lower electrode 130*b*, a second peripheral diffusion barrier pattern 136*b*, and/or a second peripheral upper electrode 138*b* that are sequentially stacked. The second N-type metal-containing pattern 124*b* may contact the second P-type metal-containing pattern 126*b*. A second peripheral gate capping pattern 140*b* may be disposed on the second peripheral gate pattern GP2.

A first gate length GL1 between opposite sidewalls of the first peripheral gate pattern GP1 may be less than a second gate length GL2 between opposite sidewalls of the second peripheral gate pattern GP2. The first peripheral gate dielectric pattern 120*a* may be thinner than the second peripheral gate dielectric pattern 118*b*. The first peripheral gate dielectric pattern 120*a* may include a different material from that of the second peripheral gate dielectric pattern 118*b*. For example, the first peripheral gate dielectric pattern 120*a* may be formed of a silicon oxynitride layer. The second peripheral gate dielectric pattern 118*b* may be formed of a silicon oxide layer.

First peripheral source/drain regions 144*a* may be disposed in the substrate 1 on opposite sides of the first peripheral gate pattern GP1. Second peripheral source/drain regions 144*b* may be disposed in the substrate 1 on opposite sides of the second peripheral gate pattern GP2. The first and second peripheral source/drain regions 144*a* and 144*b* may be doped with, for example, N-type impurities. The first peripheral source/drain region 144*a* may have an impurity concentration different from that of the second peripheral source/drain region 144*b*.

On the third peripheral region PB1, a peripheral device isolation layer (not shown) may define a third peripheral active section ACT3. On the third peripheral region PB1, a channel layer 116 may be disposed on the substrate 1. The channel layer 116 may have a lattice constant greater than that of the substrate 1. The channel layer 116 may be formed of, for example, silicon-germanium. A third peripheral gate pattern GP3 may be disposed on the channel layer 116. The third peripheral gate pattern GP3 may include a third peripheral gate dielectric pattern 120*c*, a third peripheral high-k dielectric pattern 122*c*, a third P-type metal-containing pattern 126*c*, a third peripheral lower electrode 130*c*, a third peripheral diffusion barrier pattern 136*c*, and/or a third peripheral upper electrode 138*c* that are sequentially stacked. The third peripheral high-k dielectric pattern 122*c* may contact the third P-type metal-containing pattern 126*c*. A third peripheral gate capping pattern 140*c* may be disposed on the third peripheral gate pattern GP3.

On the fourth peripheral region PB2, a peripheral device isolation layer (not shown) may define a fourth peripheral active section ACT4. On the fourth peripheral region PB2, a fourth peripheral gate pattern GP4 may be disposed on the substrate 1. The fourth peripheral gate pattern GP4 may include a fourth peripheral gate dielectric pattern 118*d*, a fourth peripheral high-k dielectric pattern 122*d*, a fourth P-type metal-containing pattern 126*d*, a fourth peripheral lower electrode 130*d*, a fourth peripheral diffusion barrier pattern 136*d*, and/or a fourth peripheral upper electrode 138*d* that are sequentially stacked. The fourth peripheral high-k dielectric pattern 122*d* may contact the fourth P-type metal-containing pattern 126*d*. A fourth gate capping pattern 140*d* may be disposed on the fourth peripheral gate pattern GP4.

Third peripheral source/drain regions 144*c* may be disposed in the channel layer 116 and the substrate 1 on opposite sides of the third peripheral gate pattern GP3. Fourth peripheral source/drain regions 144*d* may be disposed in the substrate 1 on opposite sides of the fourth peripheral gate pattern GP4. The third and fourth peripheral source/drain regions 144*c* and 144*d* may be doped with, for example, P-type impurities. The third peripheral source/ drain region 144c may have an impurity concentration different from that of the fourth peripheral source/drain region 144d.

The third peripheral gate pattern GP3 may have a gate length less than that of the fourth peripheral gate pattern GP4. The third peripheral gate dielectric pattern 120c may be thinner than the fourth peripheral gate dielectric pattern 118d. The third peripheral gate dielectric pattern 120c may include a different material from that of the fourth peripheral gate dielectric pattern 118d. For example, the third peripheral gate dielectric pattern 120c may be formed of a silicon oxynitride layer. The fourth peripheral gate dielectric pattern 118d may be formed of a silicon oxide layer.

The first, second, third, and fourth high-k dielectric patterns 122a, 122b, 122c, and 122d may be formed of a material, for example, a metal oxide layer, whose dielectric constant is greater than that of a silicon oxide layer. The first, second, third, and fourth high-k dielectric patterns 122a, 122b, 122c, and 122d may be formed of a material including at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

The first and second N-type metal-containing patterns 124a and 124b may be formed of a metal-containing layer having an N work function. The first and second N-type metal-containing patterns 124a and 124b may include at least one of lanthanum (La), lanthanum oxide (LaO), tantalum (Ta), tantalum nitride (TaN), niobium (Nb), and titanium nitride (TiN).

The first, second, third, and fourth P-type metal-containing patterns 126a, 126b, 126c, and 126d may be formed of a metal-containing layer having a P work function. The first, second, third, and fourth P-type metal-containing patterns 126a, 126b, 126c, and 126d may include at least one of aluminum (Al), aluminum oxide ($Al_2O_3$), titanium nitride (TiN), tungsten nitride (WN), and ruthenium oxide ($RuO_2$).

The first and second peripheral lower electrodes 130a and 130b may be formed of, for example, polysilicon doped with N-type impurities. The third and fourth peripheral lower electrodes 130c and 130d may be formed of, for example, polysilicon doped with P-type impurities. The first, second, third, and fourth peripheral lower electrodes 130a, 130b, 130c, and 130d may have the same thickness as that of the bit line lower electrode 130t.

The first, second, third, and fourth peripheral diffusion barrier patterns 136a, 136b, 136c, and 136d may include at least one of a titanium nitride layer, a tungsten nitride layer, and a tantalum nitride layer. The first, second, third, and fourth peripheral diffusion barrier patterns 136a, 136b, 136c, and 136d may have the same thickness as that of the bit line diffusion barrier pattern 136t. The first, second, third, and fourth peripheral upper electrodes 138a, 138b, 138c, and 138d may be formed of one of tungsten, copper, and aluminum. The first, second, third, and fourth peripheral upper electrodes 138a, 138b, 138c, and 138d may have the same thickness as that of the bit line upper electrode 138t.

The first, second, third, and fourth peripheral gate capping patterns 140a, 140b, 140c, and 140d may have the same thickness as that of the bit line capping pattern 140t.

Peripheral spacers 142 may cover sidewalls of the first, second, third, and fourth peripheral gate patterns GP1, GP2, GP3, and GP4. A peripheral interlayer dielectric layer 146 may cover the substrate 1 and sidewalls of the peripheral spacers 142. The peripheral interlayer dielectric layer 146 may be formed of, for example, a silicon oxide layer. A second capping layer 148 may be disposed on the peripheral interlayer dielectric layer 146. The second capping layer 148 may serve as an etch top layer. The second capping layer 148 may be formed of a different material from that of the peripheral interlayer dielectric layer 146. For example, the second capping layer 148 may be formed of a silicon nitride layer. The second capping layer 148 may have a thickness substantially the same as that of the second bit line capping pattern 148t.

Although not shown in FIG. 4A, the third peripheral region PB2 may be provided thereon with a peripheral device isolation layer (not shown) having the same structure as that of the second device isolation layer 9b illustrated in FIG. 1A. In addition, the first, second, and fourth peripheral regions PA1, PA2, and PB2 may be provided thereon with a device isolation layer (not shown) having the same structure as that of the first device isolation layer 9a illustrated in FIG. 1A. A peripheral device isolation layer (not shown) having the same structure as that of the third device isolation layer 9d illustrated in FIG. 1A may be disposed on a boundary between the second and third peripheral regions PA2 and PB1 or between the fourth and third peripheral regions PB2 and PB1. In addition, a dummy gate pattern GPd of FIG. 1A may be disposed on the boundary between the second and third peripheral regions PA2 and PB1 or between the fourth and third peripheral regions PB2 and PB1.

FIGS. 5A to 5L illustrate cross-sectional views showing a method of fabricating a semiconductor device having the cross-section of FIG. 4A.

Figure 5A:
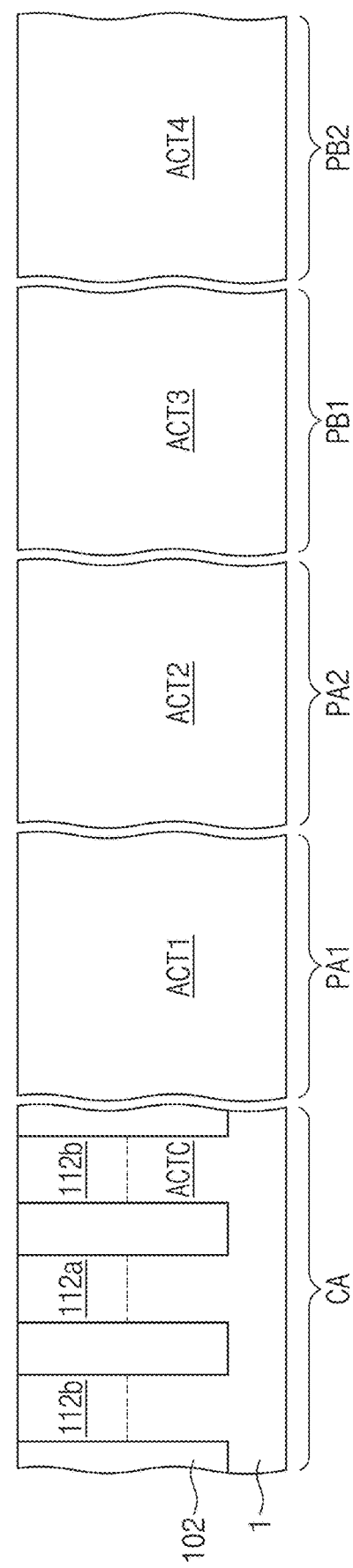

Referring to FIGS. 3 and 5A, a cell device isolation layer 102 and a peripheral device isolation layer (not shown) may be formed on a substrate 1 including a cell array region CA, a first peripheral region PA1, a second peripheral region PA2, a third peripheral region PB1, and a fourth peripheral region PB2, which may result in limiting or defining cell active sections ACTC and first, second, third, and fourth peripheral active sections ACT1, ACT2, ACT3, and ACT4. On the cell array region CA, buried word lines WL may be formed in the substrate 1. An ion implantation process may be performed to form first doped regions 112a and second doped regions 112b in the cell active sections ACTC on the cell array region CA. When the ion implantation process is performed, the first, second, third, and fourth peripheral regions PA1, PA2, PB1, and PB2 may be covered with a mask.

Figure 5B:
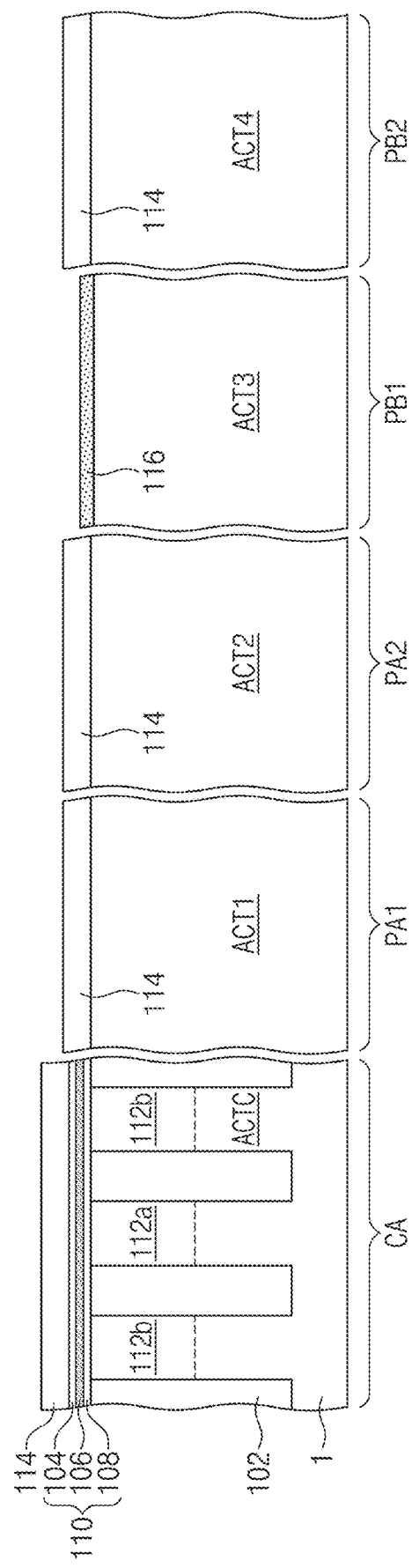

Referring to FIG. 5B, a first insulation layer 108, a second insulation layer 106, and a third insulation layer 104 may be sequentially stacked on an entire surface of the substrate 1, and then patterned to form a buffer layer 110 on the cell array region CA and to expose the first, second, third, and fourth peripheral regions PA1, PA2, PB1, and PB2. The substrate 1 may be provided with a first mask layer 114 that exposes the third peripheral region PB1 and covers the cell array region CA and the first, second, and fourth peripheral regions PA1, PA2, and PB2. The first mask layer 114 may be formed of, for example, a silicon oxide layer. The first mask layer 114 may correspond to the first mask layer 11 of FIG. 2B. The first mask layer 114 may be used as an epitaxial barrier layer to form a channel layer 116 on the substrate 1 on the third peripheral region PB1. The channel layer 116 may be formed of a silicon-germanium layer. The channel layer 116 may be formed by selective epitaxial growth (SEG).

Figure 5C:
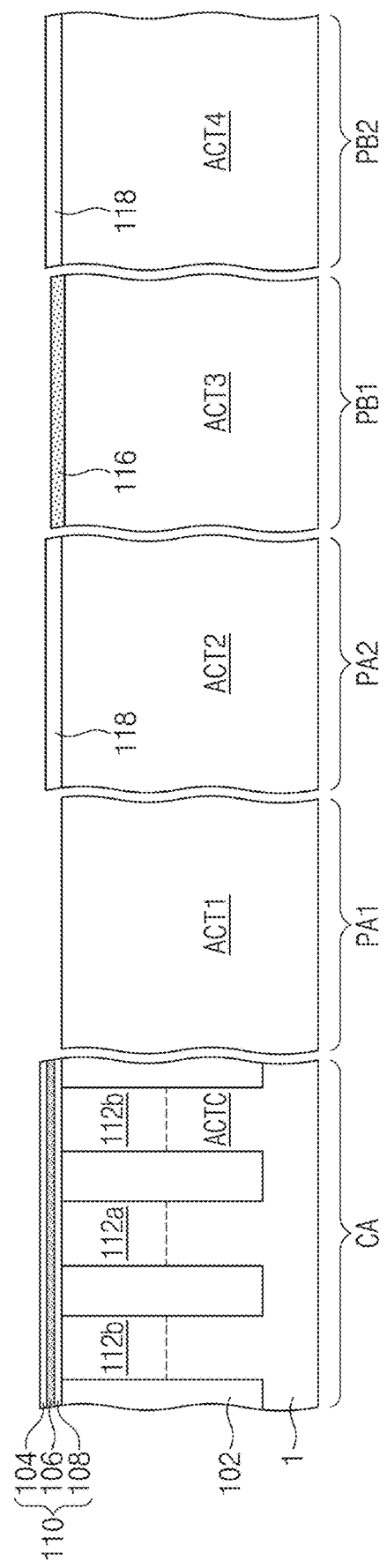

Referring to FIG. 5C, the first mask layer 114 may be removed to expose a top surface of the buffer layer 110 on the cell array region CA and also to expose a top surface of the substrate 1 on the first, second, and fourth peripheral regions PA1, PA2, and PB2. In this operation, as discussed with reference to FIG. 2C, recesses R1 and R2 may be formed on the peripheral device isolation layer disposed on the third peripheral region PB1. A separate mask (not shown) may be used to cover the cell array region CA and the first and third peripheral regions PA1 and PB1, and to form a high-voltage gate dielectric layer 118 on the substrate 1 on the second and fourth peripheral regions PA2 and PB2. The high-voltage gate dielectric layer 118 may be formed of, for example, a silicon oxide layer.

Figure 5D:
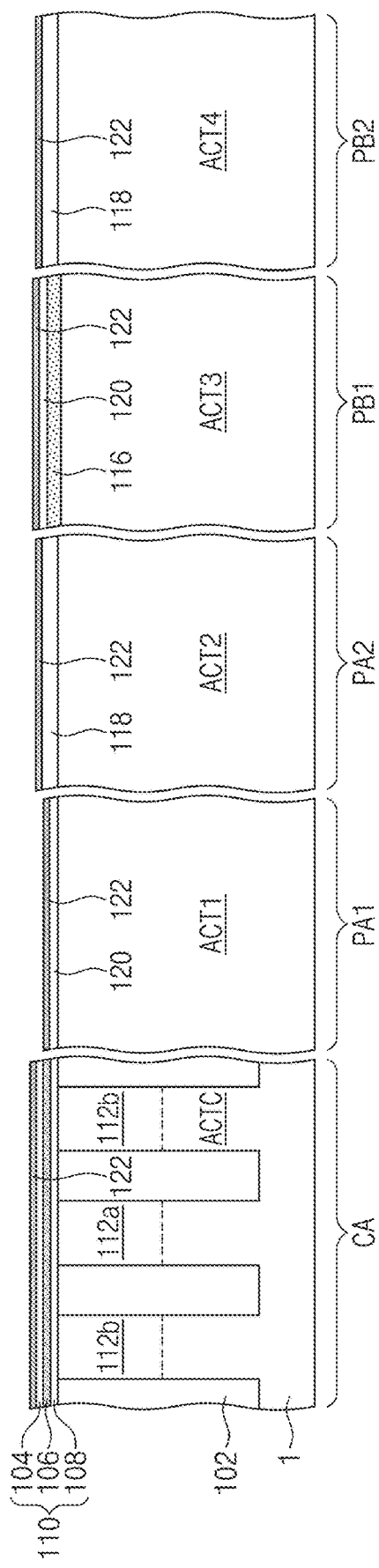

Referring to FIG. 5D, a separate mask (not shown) may be used to cover the cell array region CA and the second and fourth peripheral regions PA2 and PB2, and to form a low-voltage gate dielectric layer 120 on the substrate 1 and the channel layer 116 on the first and third peripheral regions PA1 and PB1. The low-voltage gate dielectric layer 120 may be formed of, for example, a silicon oxynitride layer. The low-voltage gate dielectric layer 120 may be formed thinner than the high-voltage gate dielectric layer 118. A high-k dielectric layer 122 may be formed on the entire surface of the substrate 1. The high-k dielectric layer 122 may be formed by a deposition process, such as chemical vapor deposition (CVD) or atomic layer deposition (ALD). The high-k dielectric layer 122 may be formed on the cell array region CA and also on the first, second, third, and fourth peripheral regions PA1, PA2, PB1, and PB2.

Figure 5E:
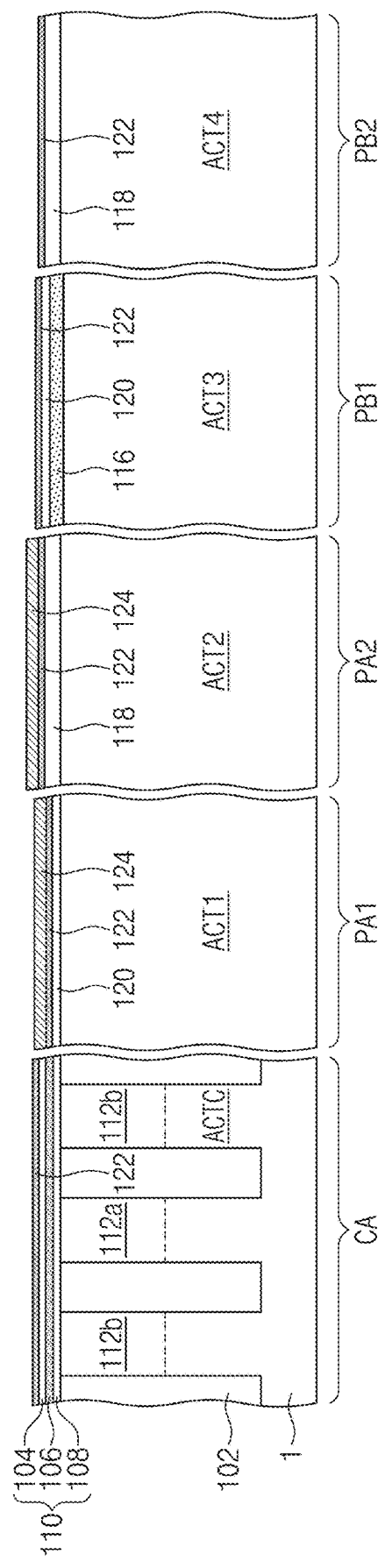

Referring to FIG. 5E, an N-type metal-containing layer 124 may be formed on the entire surface of the substrate 1 and performing a wet etching process using a mask as discussed in FIG. 2E, with the result that the N-type metal-containing layer 124 may be removed from the cell array region CA and the third and fourth peripheral regions PB1 and PB2, but remain on the first and second peripheral regions PA1 and PA2. The N-type metal-containing layer 124 may be formed of a metal-containing layer having an N work function. For example, the N-type metal-containing layer 124 may include at least one of lanthanum (La), lanthanum oxide (LaO), tantalum (Ta), tantalum nitride (TaN), niobium (Nb), and titanium nitride (TiN).

Figure 5F:
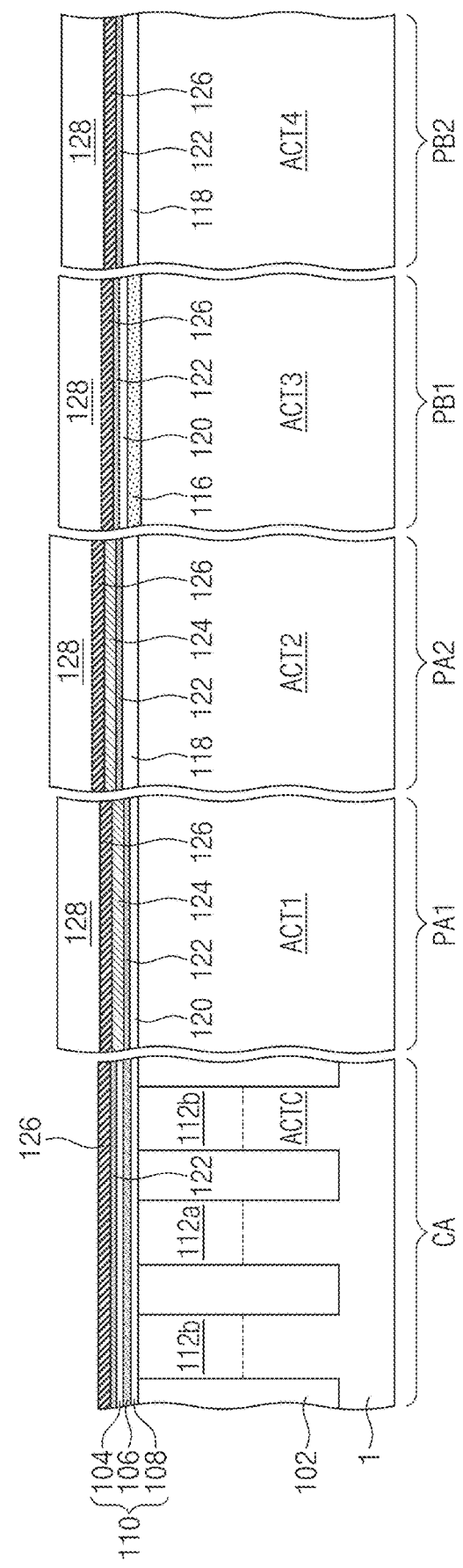

Referring to FIG. 5F, a P-type metal-containing layer 126 may be stacked on the entire surface of the substrate 1. The P-type metal-containing layer 126 may be formed of a metal-containing layer having a P work function. For example, the P-type metal-containing layer 126 may include at least one of aluminum (Al), aluminum oxide ($Al_2O_3$), titanium nitride (TiN), tungsten nitride (WN), and ruthenium oxide ($RuO_2$). A second mask layer 128 may be formed to expose the cell array region CA and to cover the P-type metal-containing layer 126 on the first, second, third, and fourth peripheral regions PA1, PA2, PB1, and PB2. The second mask layer 128 may be or include at least one of a photoresist layer, an amorphous carbon layer (ACL), a spin-on-hardmask (SOH) layer, a spin-on-carbon (SOC) layer, and a silicon nitride layer.

Referring to FIGS. 5F and 5G, the second mask layer 128 may be used as an etching mask to perform an etching process to remove the P-type metal-containing layer 126 and the high-k dielectric layer 122 from the cell array region CA. The etching process may be a wet etching process using sulfuric acid to selectively remove the P-type metal-containing layer 126 and the high-k dielectric layer 122 without damage on the buffer layer 110. The second mask layer 128 may be removed to expose the P-type metal-containing layer 126 on the first, second, third, and fourth peripheral regions PA1, PA2, PB1, and PB2. A lower electrode layer 130 may be formed on the entire surface of the substrate 1. The lower electrode layer 130 may be formed of, for example, an impurity-doped polysilicon layer. For example, the formation of the lower electrode layer 130 may include depositing a polysilicon layer on the entire surface of the substrate 1, and then performing an ion implantation process a plurality of times to dope N-type impurities into the polysilicon layer on the cell array region CA and the first and second peripheral regions PA1 and PA2 and to dope P-type impurities into the polysilicon layer on the third and fourth peripheral regions PB1 and PB2.

Figure 5H:
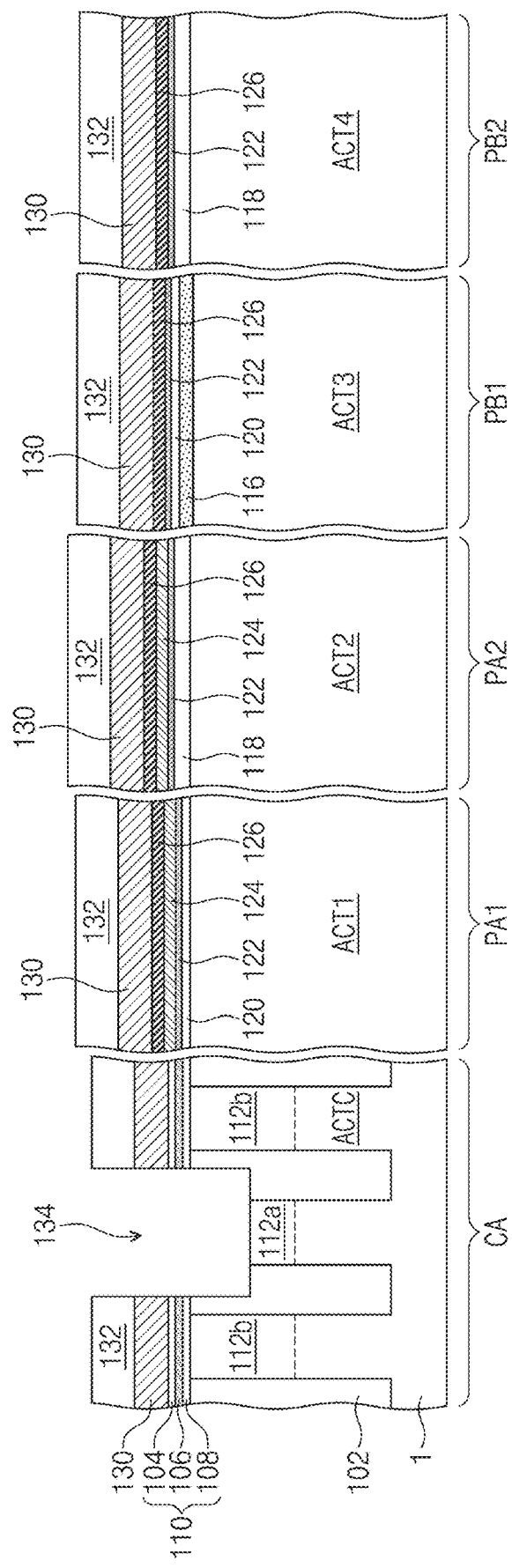

Referring to FIG. 5H, a third mask layer 132 may be formed on the lower electrode layer 130. The third mask layer 132 may have an opening that roughly limits or defines the position of a bit line contact DC which will be discussed below. The third mask layer 132 may be or include, for example, a photoresist layer, an amorphous carbon layer (ACL), a spin-on-hardmask (SOH) layer, or a spin-on-carbon (SOC) layer. The third mask layer 132 may be used as an etching mask to partially remove the lower electrode layer 130, the buffer layer 110, and the first doped region 112a of the substrate 1, which may result in the formation of a recess region 134. In this operation, an upper portion of the cell device isolation layer 102 may also be partially removed.

Figure 5I:
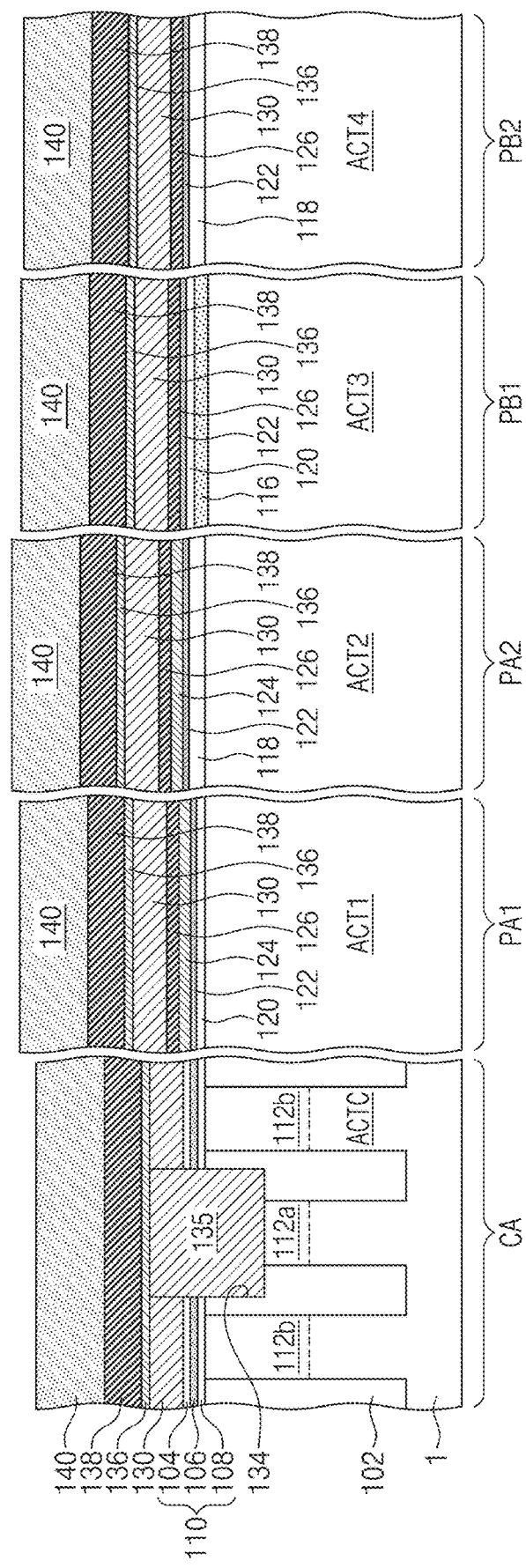

Referring to FIGS. 5H and 5I, the third mask layer 132 may be removed to expose an upper portion of the lower electrode layer 130. The substrate 1 may be provided on its entire surface with an impurity-doped polysilicon layer to fill the recess region 134, and then a chemical mechanical polishing (CMP) process may be performed to remove the polysilicon layer on the lower electrode layer 130 and to leave a polysilicon pattern 135 in the recess region 134. A diffusion barrier layer 136, an upper electrode layer 138, and a first capping layer 140 may be sequentially stacked on the lower electrode layer 130 and the polysilicon pattern 135. The diffusion barrier layer 136 may be or include at least one of a titanium nitride layer, a tungsten nitride layer, and a tantalum nitride layer. The upper electrode layer 138 may include one of tungsten, aluminum, and copper. The first capping layer 140 may be formed of, for example, a silicon nitride layer.

Figure 5J:
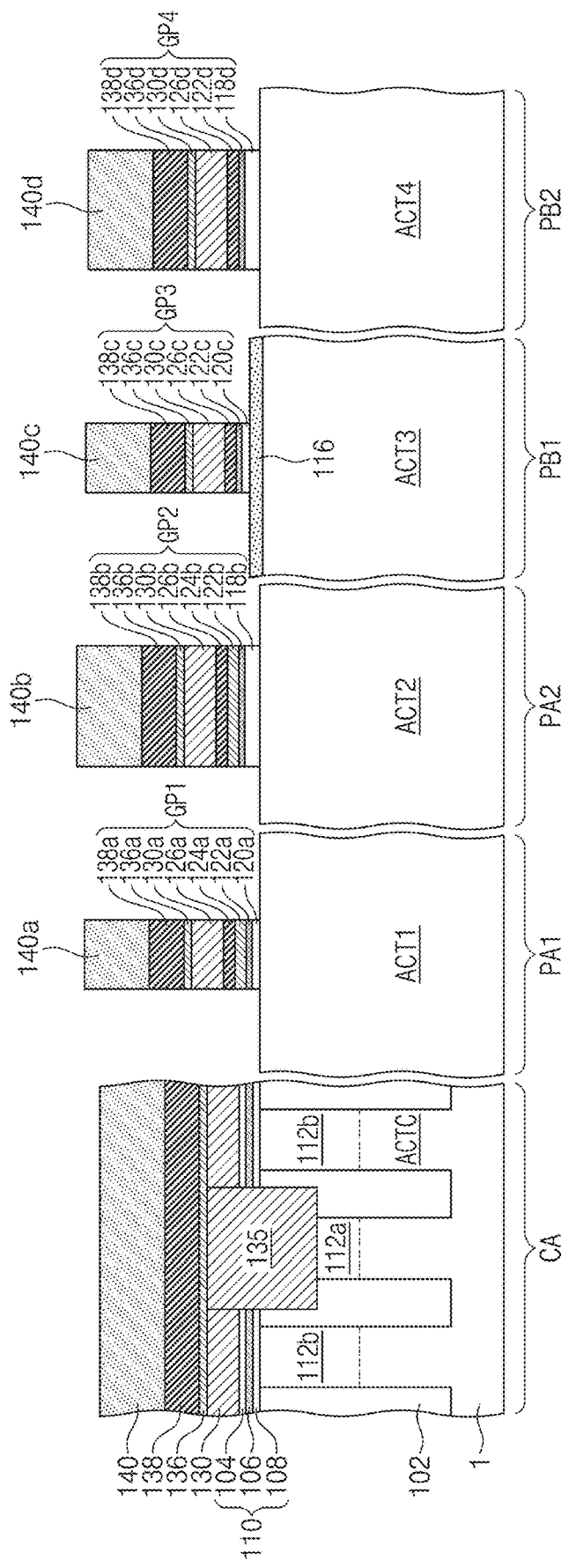

Referring to FIGS. 5I and 5J, a mask (not shown) may be used to etch the first capping layer 140, the upper electrode layer 138, the diffusion barrier layer 136, the lower electrode layer 130, the P-type metal-containing layer 126, the N-type metal-containing layer 124, the high-k dielectric layer 122, and the gate dielectric layers 118 and 120 on the first, second, third, and fourth peripheral regions PA1, PA2, PB1, and PB2, with the result that first, second, third, and fourth peripheral gate patterns GP1, GP2, GP3, and GP4 may be formed. In this operation, although not shown, a dummy gate pattern GPd of FIG. 2G may also be formed.

Figure 5K:
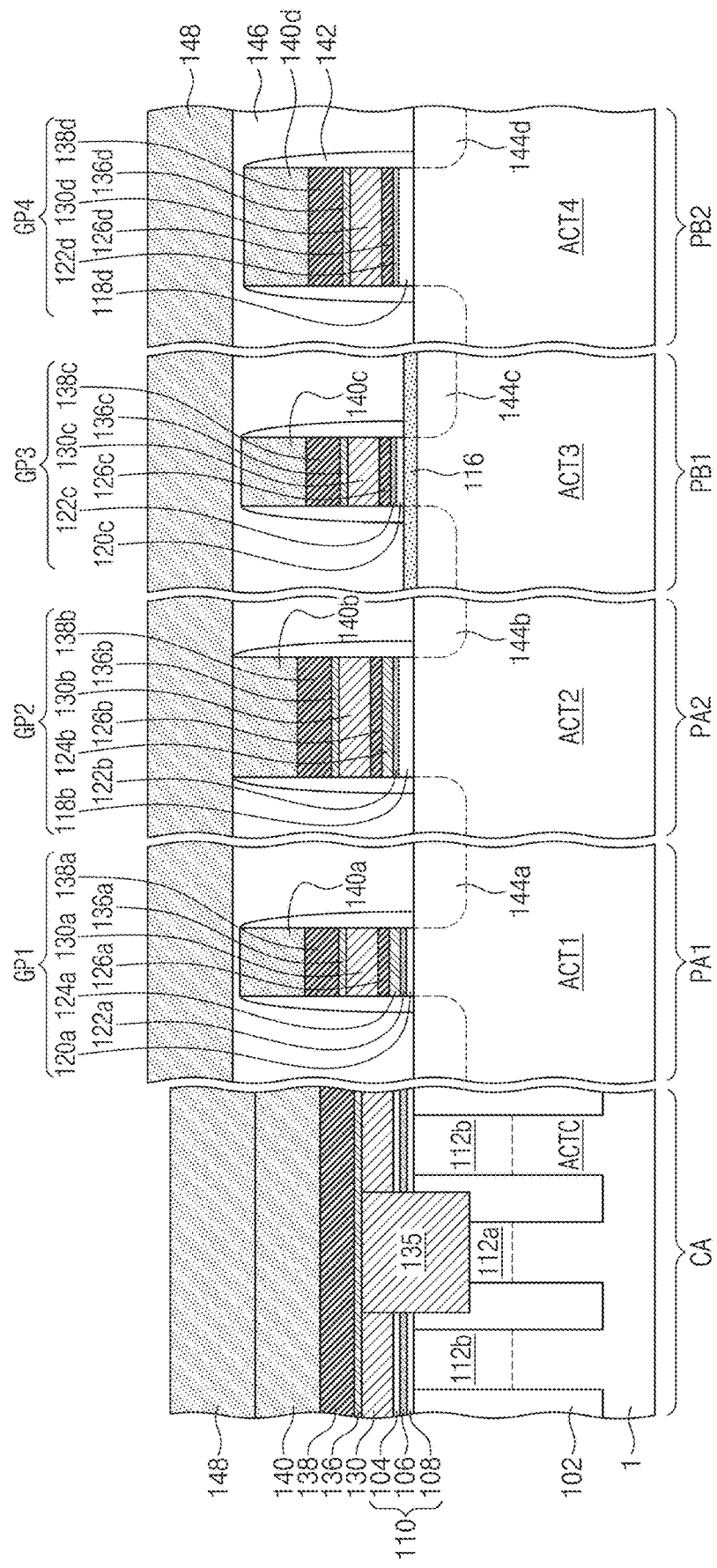

Referring to FIG. 5K, first and second peripheral source/drain regions 144a and 144b may be formed by doping, for example, N-type impurities into portions of the substrate 1 that are adjacent to the first and second peripheral gate patterns GP1 and GP2. Third and fourth peripheral source/drain regions 144c and 144d may be formed by doping, for example, P-type impurities into portions of the substrate 1 that are adjacent to the third and fourth peripheral gate patterns GP3 and GP4. A spacer layer may be conformally stacked on the entire surface of the substrate 1 and then anisotropically etched to form peripheral spacers 142 covering sidewalls of the first, second, third, and fourth peripheral gate patterns GP1, GP2, GP3, and GP4. A peripheral interlayer dielectric layer 146 may be formed on the entire surface of the substrate 1, and then a chemical mechanical polishing (CMP) process may be performed to expose at least a top surface of the second peripheral gate capping pattern 140b. In addition, on the cell array region CA, a top surface of the first capping layer 140 may also be exposed When the CMP process is performed, the dummy gate pattern GPd may reduce or prevent a dishing phenomenon of the peripheral interlayer dielectric layer 146. A second capping layer 148 may be formed on the entire surface of the substrate 1.

Figure 5L:
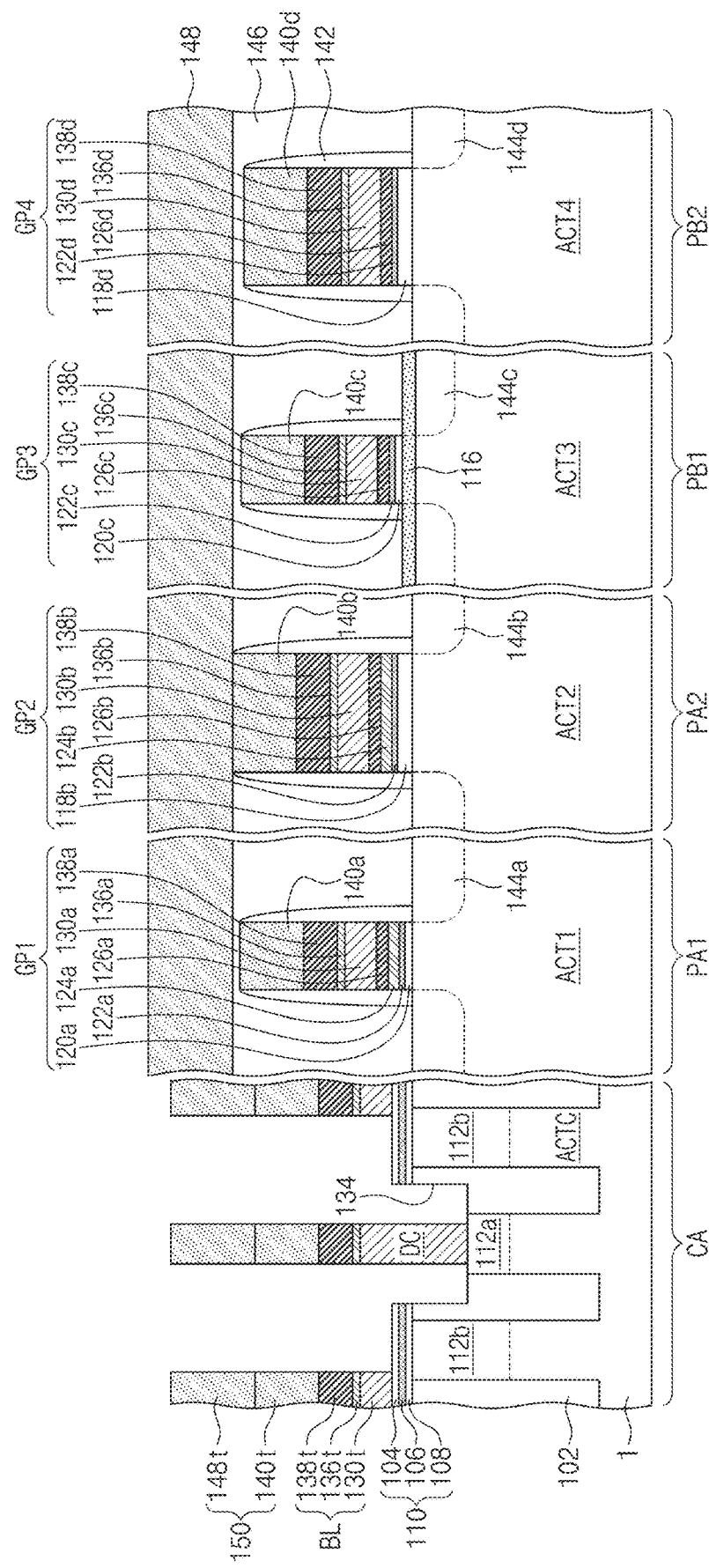

Referring to FIGS. 5K and 5L, a mask (not shown) may be used to perform an etching process to etch the second capping layer 148, the first capping layer 140, the upper electrode layer 138, the diffusion barrier layer 136, and the lower electrode layer 130 on the cell array region CA, with the result that a bit line capping pattern 150 and a bit line BL may be formed. In this operation, the polysilicon pattern 135 in the recess region 134 may also be etched to form a bit line contact DC. The recess region 134 may be exposed on its sidewall and also be partially exposed on its floor surface. Since the buffer layer 110 has a triple-layered structure including the first, second, and third insulation layers 108, 106, and 104, the etching process may be easily controlled.

Referring back to FIG. 4A, a buried insulation pattern 152 may be formed to fill the recess region 134. A first bit line spacer 154 may be formed to cover a sidewall of each of the bit line capping pattern 150 and the bit line BL. The bit line capping pattern 150 and the first bit line spacer 154 may be used as an etching mask to perform an etching process to partially remove the buffer layer 110 and the second doped region 112b that are between neighboring first bit line spacers 154. Since the buffer layer 110 has the triple-layered structure including the first, second, and third insulation layers 108, 106, and 104, the etching process may be easily controlled. As a result, a semiconductor device may be fabricated to have enhanced reliability.

A storage node contact BC coupled to the second doped region 112b may be formed between neighboring first bit line spacers 154. An upper portion of the first bit line spacer 154 may be removed, and then a second bit line spacer 156 may be formed to cover an upper sidewall of the bit line capping pattern 150 and to have a width less than that of the first bit line spacer 154. A storage node ohmic layer 158 and a landing pad diffusion barrier pattern 160 may be sequentially formed on the storage node contact BC. A metal-containing layer may be formed on the landing pad diffusion barrier pattern 160 and then patterned to form landing pads LP, and a landing pad separation pattern 162 may be formed to fill a space between the landing pads LP. A cell interlayer dielectric layer 164, a cell contact 166, and a data storage element 168 may be formed.

Figure 6A:
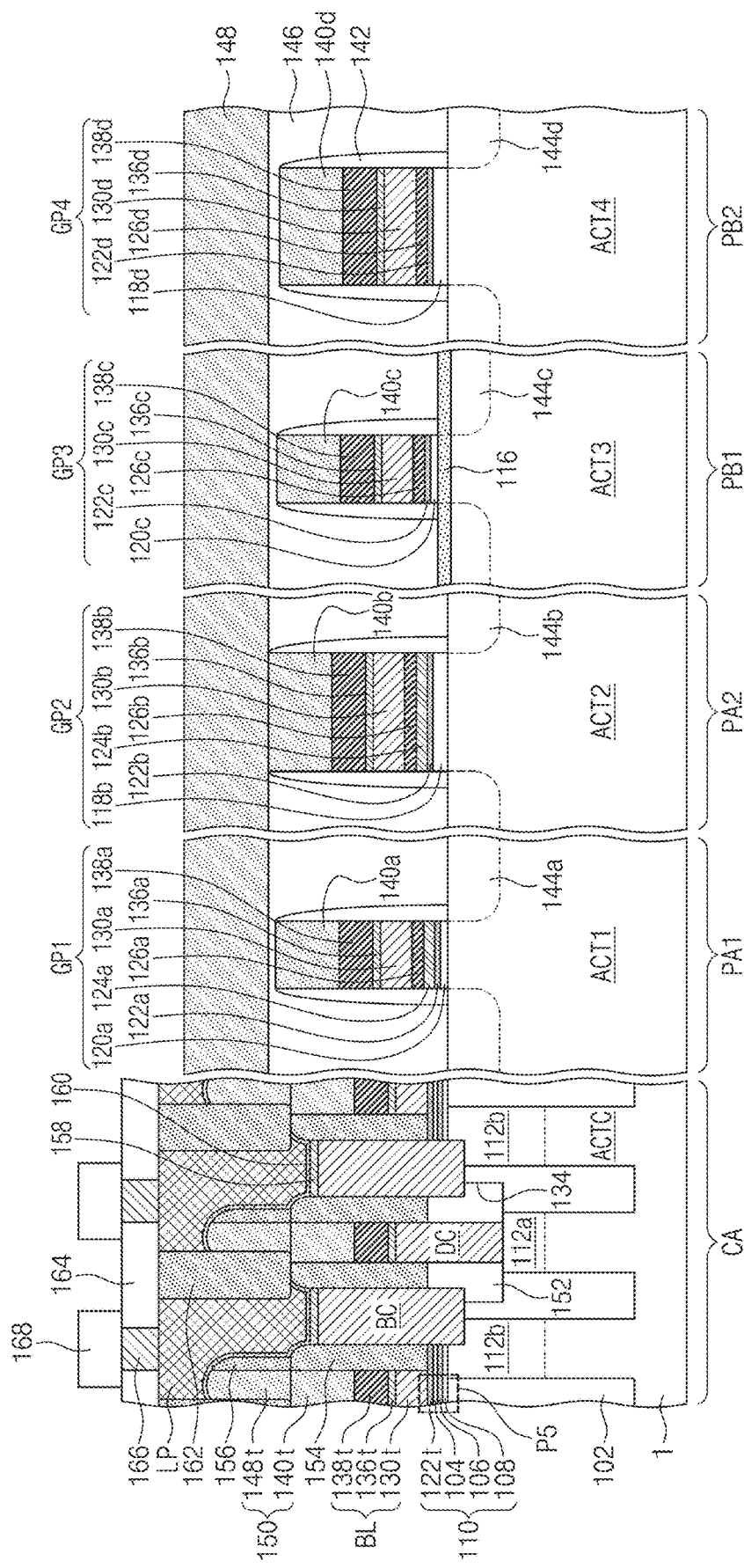
FIG. 6A illustrates a cross-sectional view taken along lines R1-R1', R2-R2', R3-R3', R4-R4', and R5-R5' of FIG. 3.
Figure 6B:
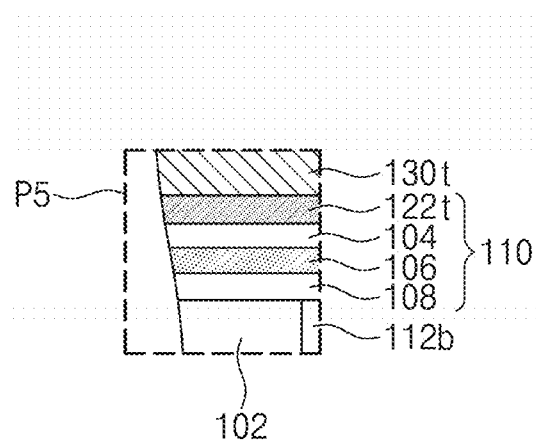
FIG. 6B illustrates an enlarged view showing section P5 of FIG. 6A.

FIG. 6A illustrates a cross-sectional view taken along lines R1-R1', R2-R2', R3-R3', R4-R4', and R5-R5' of FIG. 3. FIG. 6B illustrates an enlarged view showing section P5 of FIG. 6A.

Referring to FIGS. 6A and 6B, the buffer layer 110 may further include a cell high-k dielectric pattern 122t on the third insulation layer 104. The cell high-k dielectric pattern 122t may be formed to have the same material and thickness as those of the first, second, third, and fourth high-k dielectric patterns 122a, 122b, 122c, and 122d. When, in the operation of FIG. 5F, the P-type metal-containing layer 126 is removed from the cell array region CA and the high-k dielectric layer 122 remains on the cell array region CA, a semiconductor device may be fabricated in accordance with example embodiments. Since the buffer layer 110 has a quadruple-layered structure including the cell high-k dielectric pattern 122t besides the first, second, and third insulation layers 108, 106, and 104, the buffer layer 110 may serve as an improved etch stop layer during the etching process for forming the bit line BL as illustrated in FIG. 5L.

According to some example embodiments of inventive concepts, an NMOS region may be reduced or prevented from being over-etched such that a semiconductor device may be fabricated to have enhanced reliability.

What is claimed is:

1. A method of fabricating a semiconductor device, comprising:
   providing a substrate comprising a first region and a second region;
   forming a first gate dielectric layer and a second gate dielectric layer on the substrate of the first region and the second region, respectively;
   forming an N-type metal-containing layer on the first gate dielectric layer and the second gate dielectric layer;
   removing the N-type metal-containing layer on the second region;
   sequentially forming a P-type metal-containing layer, an electrode layer, and a capping layer on an entire surface of the substrate; and
   patterning the capping layer, the electrode layer, the P-type metal-containing layer, the N-type metal-containing layer and the first gate dielectric layer on the first region to form a first gate pattern and patterning the capping layer, the electrode layer, the P-type metal-containing layer and the second gate dielectric layer to form a second gate pattern on the second region.

2. The method of claim 1, further comprising:
   patterning the capping layer, the electrode layer, the P-type metal-containing layer and the N-type metal-containing layer to form a dummy gate pattern between the first region and the second region,
   wherein the dummy gate pattern comprises:
   a first segment adjacent to the first region; and
   a second segment adjacent to the second region,
   wherein the first segment of the dummy gate pattern comprises a dummy high-k dielectric pattern, a dummy N-type metal-containing pattern, and a dummy P-type metal-containing pattern that are sequentially stacked, and
   wherein the second segment of the dummy gate pattern excludes the dummy N-type metal-containing pattern.

3. The method of claim 1, before forming the first gate dielectric layer and the second gate dielectric layer, further comprising:
   forming first to third device isolation patterns in the substrate, the first device isolation pattern being at the first region, the second device isolation pattern being at the second region and the third device isolation pattern being between the first region and the second region;
   forming a first mask layer covering the first device isolation pattern, a portion of the third device isolation pattern and the substrate of the first region;
   forming a channel layer on the substrate of the second region; and
   removing the first mask layer.

4. The method of claim 3, wherein the forming of the channel layer includes forming a silicon germanium layer by performing a selective epitaxial growth method.

5. The method of claim 3, further comprising:
removing another portion of the third device isolation pattern to form at least one recess region at the third device isolation pattern when the first mask layer is removed.

6. The method of claim 1, wherein the substrate further comprises a cell region, and the method further comprises:
forming a buffer layer on the substrate of the cell region, before forming the first gate dielectric layer and the second gate dielectric layer.

7. The method of claim 6, wherein the buffer layer comprise a first insulation layer, a second insulation layer and a third insulation layer that are sequentially stacked, and the second insulation layer is formed of a material having an etch selectivity to both the first insulation layer and the third insulation layer.

8. The method of claim 6, wherein the removing of the N-type metal-containing layer exposes the cell region.

9. The method of claim 6, wherein the electrode layer and the capping layer cover the buffer layer at the cell region.

10. The method of claim 6, after forming the first gate pattern and the second gate pattern, further comprising:
patterning the capping layer and the electrode layer to form a bit line at the cell region.

11. A method of fabricating a semiconductor device, comprising:
providing a substrate comprising a cell region, an NMOS region, and a PMOS region;
forming a first gate dielectric layer and a second gate dielectric layer on the substrate of the NMOS region and the PMOS region, respectively;
forming an N-type metal-containing layer on the first gate dielectric layer and the second gate dielectric layer;
removing the N-type metal-containing layer on the PMOS region;
forming a P-type metal-containing layer on an entire surface of the substrate;
removing the P-type metal-containing layer on the cell region;
forming an electrode layer and a first capping layer on an entire surface of the substrate; and
patterning the first capping layer, the electrode layer, the P-type metal-containing layer, the N-type metal-containing layer and the first gate dielectric layer on the NMOS region to form a first gate pattern and patterning the first capping layer, the electrode layer, the P-type metal-containing layer and the second gate dielectric layer to form a second gate pattern on the PMOS region.

12. The method of claim 11, further comprising:
forming an interlayer dielectric layer to cover the first gate pattern and the second gate pattern;
forming a second capping layer on an entire surface of the substrate; and
patterning the second capping layer, the first capping layer and the electrode layer to form a bit line at the cell region.

13. The method of claim 11, further comprising:
patterning the first capping layer, the electrode layer, the P-type metal-containing layer and the N-type metal-containing layer to form a dummy gate pattern between the NMOS region and the PMOS region,
wherein the dummy gate pattern comprises:
a first segment adjacent to the NMOS region; and
a second segment adjacent to the PMOS region,
wherein the first segment of the dummy gate pattern comprises a dummy high-k dielectric pattern, a dummy N-type metal-containing pattern, and a dummy P-type metal-containing pattern that are sequentially stacked, and
wherein the second segment of the dummy gate pattern excludes the dummy N-type metal-containing pattern.

14. The method of claim 11, before forming the first gate dielectric layer and the second gate dielectric layer, further comprising:
forming first to third device isolation patterns in the substrate, the first device isolation pattern being at the NMOS region, the second device isolation pattern being at the PMOS region and the third device isolation pattern being between the NMOS region and the PMOS region;
forming a first mask layer covering the first device isolation pattern, a portion of the third device isolation pattern and the substrate of the NMOS region;
forming a channel layer on the substrate of the PMOS region; and
removing the first mask layer.

15. The method of claim 14, further comprising:
removing another portion of the third device isolation pattern to form at least one recess region at the third device isolation pattern when the first mask layer is removed.

16. The method of claim 11, further comprising:
forming a buffer layer on the substrate of the cell region, before forming the first gate dielectric layer and the second gate dielectric layer.

17. The method of claim 16, wherein the buffer layer comprise a first insulation layer, a second insulation layer and a third insulation layer that are sequentially stacked, and the second insulation layer is formed of a material having an etch selectivity to both the first insulation layer and the third insulation layer.

18. A method of fabricating a semiconductor device, comprising:
providing a substrate comprising a first region and a second region;
forming a first gate dielectric layer and a second gate dielectric layer on the substrate of the first region and the second region, respectively;
forming an N-type metal-containing layer on the first gate dielectric layer and the second gate dielectric layer;
removing the N-type metal-containing layer on the second region;
sequentially forming a P-type metal-containing layer, an electrode layer, and a capping layer on an entire surface of the substrate;
patterning the capping layer, the electrode layer, the P-type metal-containing layer, the N-type metal-containing layer and the first gate dielectric layer on the first region to form a first gate pattern and patterning the capping layer, the electrode layer, the P-type metal-containing layer and the second gate dielectric layer to form a second gate pattern on the second region, and
patterning the capping layer, the electrode layer, the P-type metal-containing layer and the N-type metal-containing layer to form a dummy gate pattern between the first region and the second region,
wherein the dummy gate pattern comprises:
a first segment adjacent to the first region; and
a second segment adjacent to the second region,
wherein the first segment of the dummy gate pattern comprises a dummy high-k dielectric pattern, a dummy N-type metal-containing pattern, and a dummy P-type metal-containing pattern that are sequentially stacked, and wherein the second segment of the dummy gate pattern excludes the dummy N-type metal-containing pattern.

19. The method of claim 18, before forming the first gate dielectric layer and the second gate dielectric layer, further comprising:

forming first to third device isolation patterns in the substrate, the first device isolation pattern being at the first region, the second device isolation pattern being at the second region and the third device isolation pattern being between the first region and the second region;

forming a first mask layer covering the first device isolation pattern, a portion of the third device isolation pattern and the substrate of the first region;

forming a channel layer on the substrate of the second region; and removing the first mask layer.

20. The method of claim 19, further comprising:

removing another portion of the third device isolation pattern to form at least one recess region at the third device isolation pattern when the first mask layer is removed.

* * * * *